(12) United States Patent
Kadkhodayan et al.

(10) Patent No.: US 8,161,906 B2
(45) Date of Patent: *Apr. 24, 2012

(54) CLAMPED SHOWERHEAD ELECTRODE ASSEMBLY

(75) Inventors: Babak Kadkhodayan, Pleasanton, CA (US); Rajinder Dhindsa, San Jose, CA (US); Anthony de la Llera, Fremont, CA (US); Michael C. Kellogg, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 758 days.

This patent is subject to a terminal disclaimer.

(21) Appl. No.: 12/216,526

(22) Filed: Jul. 7, 2008

(65) Prior Publication Data

US 2010/0003824 A1  Jan. 7, 2010

(51) Int. Cl.
*C23C 16/50* (2006.01)
*C23C 16/503* (2006.01)
*C23C 16/505* (2006.01)
*C23C 16/509* (2006.01)
*C23F 1/00* (2006.01)
*H01L 21/306* (2006.01)
*C23C 16/06* (2006.01)
*C23C 16/22* (2006.01)

(52) U.S. Cl. .............. 118/723 E; 118/715; 156/345.43; 156/345.33; 156/345.34

(58) Field of Classification Search .............. 118/723 E, 118/715; 156/345.43, 345.33, 345.34
See application file for complete search history.

(56) References Cited

U.S. PATENT DOCUMENTS

| | | | |
|---|---|---|---|
| 3,456,549 A * | 7/1969 | Horton | 411/427 |
| 4,324,036 A * | 4/1982 | Reilly | 29/437 |
| 4,585,920 A | 4/1986 | Hoog et al. | |
| 4,612,077 A | 9/1986 | Tracy et al. | |
| 4,908,095 A | 3/1990 | Kagatsume et al. | |
| 5,074,456 A * | 12/1991 | Degner et al. | 228/121 |
| 5,200,016 A | 4/1993 | Namose | |
| 5,356,515 A | 10/1994 | Tahara et al. | |
| 5,423,936 A | 6/1995 | Tomita et al. | |

(Continued)

FOREIGN PATENT DOCUMENTS

JP  56-087667 A1  7/1981

(Continued)

OTHER PUBLICATIONS

International Search Report and Written Opinion mailed Feb. 24, 2010 for PCT/US2009/003953.

(Continued)

*Primary Examiner* — Rudy Zervigon
(74) *Attorney, Agent, or Firm* — Buchanan Ingersoll & Rooney PC

(57) ABSTRACT

An electrode assembly for a plasma reaction chamber used in semiconductor substrate processing. The assembly includes an upper showerhead electrode which includes an inner electrode mechanically attached to a backing plate by a clamp ring and an outer electrode attached to the backing plate by a series of spaced apart cam locks. A guard ring surrounds the backing plate and is movable to positions at which openings in the guard ring align with openings in the backing plate so that the cam locks can be rotated with a tool to release cam pins extending upward from the upper face of the outer electrode. To compensate for differential thermal expansion, the clamp ring can include expansion joins at spaced locations which allow the clamp ring to absorb thermal stresses.

17 Claims, 14 Drawing Sheets

U.S. PATENT DOCUMENTS

| | | | |
|---|---|---|---|
| D363,464 S | 10/1995 | Fukasawa | |
| 5,472,565 A * | 12/1995 | Mundt et al. | 216/71 |
| 5,500,256 A | 3/1996 | Watabe et al. | |
| 5,534,751 A | 7/1996 | Lenz et al. | |
| 5,569,356 A | 10/1996 | Lenz et al. | |
| 5,589,002 A | 12/1996 | Su | |
| 5,590,975 A | 1/1997 | Horntvedt | |
| 5,593,540 A | 1/1997 | Tomita et al. | |
| 5,624,498 A | 4/1997 | Lee et al. | |
| 5,740,009 A | 4/1998 | Pu et al. | |
| 5,746,875 A | 5/1998 | Maydan et al. | |
| 5,766,364 A * | 6/1998 | Ishida et al. | 118/725 |
| 5,792,269 A | 8/1998 | Deacon et al. | |
| D411,516 S | 6/1999 | Imafuku et al. | |
| D412,513 S | 8/1999 | Ooyabu | |
| 5,959,409 A | 9/1999 | Dornfest et al. | |
| 5,993,597 A | 11/1999 | Saito et al. | |
| 5,997,649 A | 12/1999 | Hillman | |
| D420,022 S | 2/2000 | Burkhart et al. | |
| 6,024,799 A | 2/2000 | chen et al. | |
| 6,036,782 A * | 3/2000 | Tanaka et al. | 118/715 |
| 6,039,836 A | 3/2000 | Dhindsa et al. | |
| 6,050,216 A | 4/2000 | Szapucki et al. | |
| 6,050,506 A | 4/2000 | Guo et al. | |
| D425,919 S | 5/2000 | Burkhart et al. | |
| 6,079,356 A | 6/2000 | Umotoy et al. | |
| 6,086,710 A | 7/2000 | Miyashita et al. | |
| 6,110,287 A | 8/2000 | Arai et al. | |
| 6,110,556 A | 8/2000 | Bang et al. | |
| 6,132,512 A | 10/2000 | Horie et al. | |
| 6,170,432 B1 | 1/2001 | Szapucki et al. | |
| 6,173,673 B1 | 1/2001 | Golovato et al. | |
| 6,200,415 B1 | 3/2001 | Maraschin | |
| 6,206,972 B1 | 3/2001 | Dunham | |
| 6,207,006 B1 * | 3/2001 | Katoh | 156/345.29 |
| D441,348 S | 5/2001 | Todd et al. | |
| 6,228,208 B1 | 5/2001 | Lill et al. | |
| 6,237,528 B1 | 5/2001 | Szapucki et al. | |
| 6,245,192 B1 * | 6/2001 | Dhindsa et al. | 156/345.34 |
| 6,302,964 B1 | 10/2001 | Umotoy et al. | |
| 6,368,450 B2 | 4/2002 | Hayashi | |
| 6,389,677 B1 | 5/2002 | Lenz | |
| 6,391,787 B1 | 5/2002 | Dhindsa et al. | |
| 6,432,261 B2 | 8/2002 | Watanabe et al. | |
| 6,444,037 B1 | 9/2002 | Frankel et al. | |
| 6,461,435 B1 | 10/2002 | Littau et al. | |
| 6,477,980 B1 | 11/2002 | White et al. | |
| 6,495,233 B1 | 12/2002 | Shmurun et al. | |
| 6,506,686 B2 | 1/2003 | Masuda et al. | |
| 6,537,928 B1 * | 3/2003 | Matsuki et al. | 438/788 |
| 6,550,126 B1 | 4/2003 | Szettella et al. | |
| 6,553,932 B2 | 4/2003 | Liu et al. | |
| 6,558,506 B1 | 5/2003 | Freeman et al. | |
| 6,586,886 B1 | 7/2003 | Katz et al. | |
| 6,653,734 B2 | 11/2003 | Flanner et al. | |
| 6,700,089 B1 * | 3/2004 | Hirooka | 219/121.4 |
| 6,723,202 B2 | 4/2004 | Nagaiwa et al. | |
| D490,450 S | 5/2004 | Hayashi et al. | |
| 6,753,498 B2 | 6/2004 | Sirkis et al. | |
| D493,873 S | 8/2004 | Hayashi | |
| 6,786,175 B2 | 9/2004 | Dhindsa et al. | |
| 6,818,096 B2 * | 11/2004 | Barnes et al. | 156/345.43 |
| 6,827,815 B2 * | 12/2004 | Hytros et al. | 156/345.33 |
| 6,872,258 B2 | 3/2005 | Park et al. | |
| 6,899,786 B2 * | 5/2005 | Senzaki et al. | 156/345.43 |
| 6,936,135 B2 * | 8/2005 | Antolik | 156/345.53 |
| 6,942,753 B2 | 9/2005 | Choi et al. | |
| 7,083,702 B2 | 8/2006 | Blonigan et al. | |
| 7,159,537 B2 | 1/2007 | Wickramanayaka et al. | |
| 7,166,200 B2 | 1/2007 | Saigusa et al. | |
| 7,196,283 B2 | 3/2007 | Buchberger, Jr. et al. | |
| 7,270,713 B2 * | 9/2007 | Blonigan et al. | 118/715 |
| 7,296,534 B2 * | 11/2007 | Fink | 118/723 E |
| 7,461,614 B2 * | 12/2008 | Fink et al. | 118/723 E |
| 7,481,903 B2 * | 1/2009 | Senzaki et al. | 156/345.43 |
| 7,482,550 B2 * | 1/2009 | Larson et al. | 219/121.43 |
| 7,484,473 B2 * | 2/2009 | Keller et al. | 118/723 R |
| 7,543,547 B1 * | 6/2009 | Kennedy et al. | 118/723 E |
| 7,641,762 B2 * | 1/2010 | Keller | 156/345.34 |
| 7,645,341 B2 * | 1/2010 | Kennedy et al. | 118/715 |
| 7,661,386 B2 * | 2/2010 | Kasai et al. | 118/666 |
| 7,662,254 B2 * | 2/2010 | Sexton et al. | 156/345.43 |
| 7,712,434 B2 * | 5/2010 | Dhindsa et al. | 118/723 E |
| 7,743,730 B2 * | 6/2010 | Kholodenko et al. | 118/723 E |
| 7,776,178 B2 * | 8/2010 | Keller | 156/345.34 |
| 7,827,657 B2 * | 11/2010 | Kennedy et al. | 29/20 |
| 7,827,931 B2 * | 11/2010 | Matsushima et al. | 118/723 E |
| 7,862,682 B2 * | 1/2011 | Stevenson et al. | 156/345.34 |
| 7,875,824 B2 * | 1/2011 | Larson et al. | 219/121.43 |
| 2001/0000104 A1 | 4/2001 | Li et al. | |
| 2002/0048963 A1 | 4/2002 | Campbell et al. | |
| 2002/0069968 A1 * | 6/2002 | Keller et al. | 156/345.33 |
| 2002/0139479 A1 | 10/2002 | Antolik | |
| 2002/0150519 A1 * | 10/2002 | Barnes et al. | 422/186.04 |
| 2002/0179245 A1 | 12/2002 | Masuda et al. | |
| 2003/0066607 A1 * | 4/2003 | White et al. | 156/345.34 |
| 2003/0127806 A1 | 7/2003 | Belchuk | |
| 2003/0185729 A1 | 10/2003 | Ko et al. | |
| 2004/0074609 A1 * | 4/2004 | Fischer et al. | 156/914 |
| 2004/0108301 A1 | 6/2004 | Hao et al. | |
| 2004/0173313 A1 | 9/2004 | Beach | |
| 2004/0206305 A1 * | 10/2004 | Choi et al. | 118/715 |
| 2005/0000430 A1 * | 1/2005 | Jang et al. | 118/715 |
| 2005/0056218 A1 | 3/2005 | Sun et al. | |
| 2005/0061445 A1 * | 3/2005 | Koshiishi et al. | 156/345.47 |
| 2005/0116427 A1 | 6/2005 | Seidel et al. | |
| 2005/0133160 A1 * | 6/2005 | Kennedy et al. | 156/345.34 |
| 2005/0150456 A1 | 7/2005 | Senzaki et al. | |
| 2005/0241765 A1 | 11/2005 | Dhindsa et al. | |
| 2005/0276928 A1 | 12/2005 | Okumura et al. | |
| 2006/0000803 A1 | 1/2006 | Koshiishi et al. | |
| 2006/0016559 A1 | 1/2006 | Kobayashi et al. | |
| 2006/0037701 A1 | 2/2006 | Koshiishi et al. | |
| 2006/0042754 A1 | 3/2006 | Yoshida et al. | |
| 2006/0043067 A1 | 3/2006 | Kadkhodayan et al. | |
| 2006/0066247 A1 | 3/2006 | Koshiishi et al. | |
| 2006/0075969 A1 | 4/2006 | Fischer | |
| 2006/0090704 A1 | 5/2006 | Ide et al. | |
| 2006/0108069 A1 | 5/2006 | Gernert | |
| 2006/0207502 A1 | 9/2006 | Dhindsa et al. | |
| 2006/0213617 A1 * | 9/2006 | Fink | 156/345.47 |
| 2006/0225655 A1 * | 10/2006 | Faguet et al. | 118/723 R |
| 2006/0236934 A1 | 10/2006 | Choi et al. | |
| 2006/0254512 A1 * | 11/2006 | Fink | 118/715 |
| 2006/0283551 A1 | 12/2006 | Son | |
| 2006/0283552 A1 | 12/2006 | Rogers | |
| 2007/0032081 A1 | 2/2007 | Chang et al. | |
| 2007/0044716 A1 | 3/2007 | Tetsuka et al. | |
| 2007/0068629 A1 | 3/2007 | Shih et al. | |
| 2007/0131350 A1 | 6/2007 | Ricci et al. | |
| 2007/0137573 A1 * | 6/2007 | Kholodenko et al. | 118/723 E |
| 2007/0181868 A1 | 8/2007 | Fujiwara et al. | |
| 2007/0187038 A1 * | 8/2007 | Ren et al. | 156/345.43 |
| 2007/0215580 A1 | 9/2007 | Koshiishi et al. | |
| 2007/0235660 A1 * | 10/2007 | Hudson | 250/423 P |
| 2007/0284045 A1 | 12/2007 | Fischer et al. | |
| 2007/0284246 A1 * | 12/2007 | Keil et al. | 204/298.36 |
| 2008/0087641 A1 | 4/2008 | La Llera et al. | |
| 2008/0090417 A1 | 4/2008 | La Llera et al. | |
| 2008/0099120 A1 * | 5/2008 | Larson et al. | 156/1 |
| 2008/0099448 A1 * | 5/2008 | Larson et al. | 219/121.43 |
| 2008/0141941 A1 | 6/2008 | Augustino et al. | |
| 2008/0227301 A1 | 9/2008 | Fang et al. | |
| 2008/0308228 A1 * | 12/2008 | Stevenson et al. | 156/345.34 |
| 2008/0308229 A1 | 12/2008 | Patrick et al. | |
| 2009/0081878 A1 | 3/2009 | Dhindsa | |
| 2009/0095220 A1 | 4/2009 | Meinhold et al. | |
| 2009/0095424 A1 | 4/2009 | Bettencourt et al. | |
| 2009/0111276 A1 * | 4/2009 | Dhindsa et al. | 438/710 |
| 2009/0127234 A1 * | 5/2009 | Larson et al. | 219/121.43 |
| 2009/0163034 A1 * | 6/2009 | Larson et al. | 438/729 |
| 2009/0211085 A1 * | 8/2009 | Kennedy et al. | 29/825 |
| 2009/0223932 A1 | 9/2009 | Hida et al. | |
| 2009/0305509 A1 * | 12/2009 | Stevenson et al. | 438/710 |
| 2010/0000683 A1 * | 1/2010 | Kadkhodayan et al. | 156/345.34 |
| 2010/0003824 A1 * | 1/2010 | Kadkhodayan et al. | 438/710 |
| 2010/0003829 A1 * | 1/2010 | Patrick et al. | 438/758 |

| | | | |
|---|---|---|---|
| 2010/0038033 | A1 | 2/2010 | Hardin et al. |
| 2010/0065214 | A1* | 3/2010 | Kennedy et al. ......... 156/345.34 |
| 2010/0184298 | A1* | 7/2010 | Dhindsa ........................ 438/710 |
| 2010/0252197 | A1 | 10/2010 | Kadkhodayan et al. |
| 2010/0261354 | A1* | 10/2010 | Bettencourt et al. .......... 438/710 |
| 2011/0067814 | A1* | 3/2011 | Fischer et al. ............. 156/345.1 |
| 2011/0070740 | A1* | 3/2011 | Bettencourt et al. .......... 438/710 |
| 2011/0081783 | A1* | 4/2011 | Stevenson et al. ............ 438/710 |
| 2011/0083809 | A1* | 4/2011 | de la Llera et al. ...... 156/345.34 |

FOREIGN PATENT DOCUMENTS

| | | |
|---|---|---|
| JP | 07-066180 A | 3/1995 |
| JP | 09-013172 A | 1/1997 |
| JP | 09-245994 | 9/1997 |
| JP | 2001085398 A | 3/2001 |
| WO | WO2009/114175 A2 | 9/2009 |

OTHER PUBLICATIONS

Commonly owned U.S. Appl. No. 61/036,862, filed Mar. 14, 2008.
Commonly owned U.S. Appl. No. 11/896,375, filed Aug. 31, 2007.
Commonly owned U.S. Appl. No. 12/216,526, filed Jul. 7, 2008.
Commonly Owned U.S. Appl. No. 12/875,869, filed Sep. 3, 2010.
Commonly Owned U.S. Appl. No. 12/884,269, filed Sep. 17, 2010.
Commonly Owned U.S. Appl. No. 12/903,412, filed Oct. 13, 2010.
Commonly Owned U.S. Appl. No. 12/872,980, filed Aug. 31, 2010.
Commonly Owned U.S. Appl. No. 12/872,982, filed Aug. 31, 2010.
Commonly Owned U.S. Appl. No. 12/872,984, filed Aug. 31, 2010.
Official Action dated Jan. 22, 2010 for Chinese Patent Appln. No. 201020114128.8.

* cited by examiner

SECTION A-A

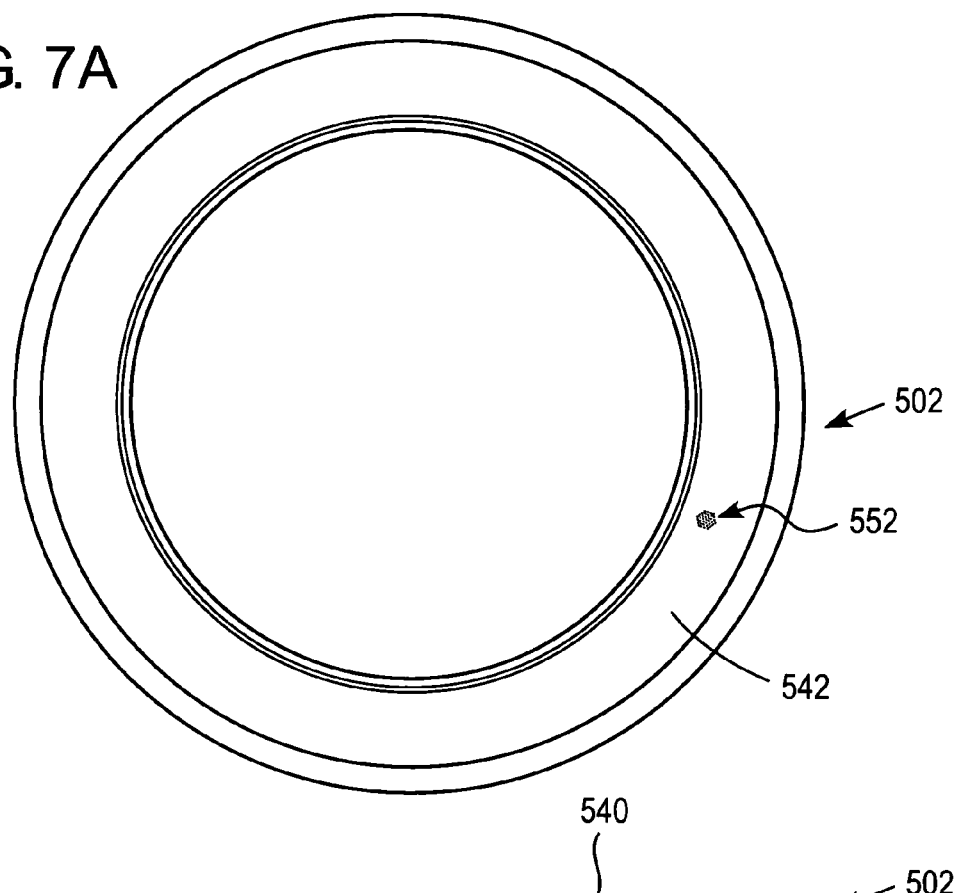
FIG. 7A
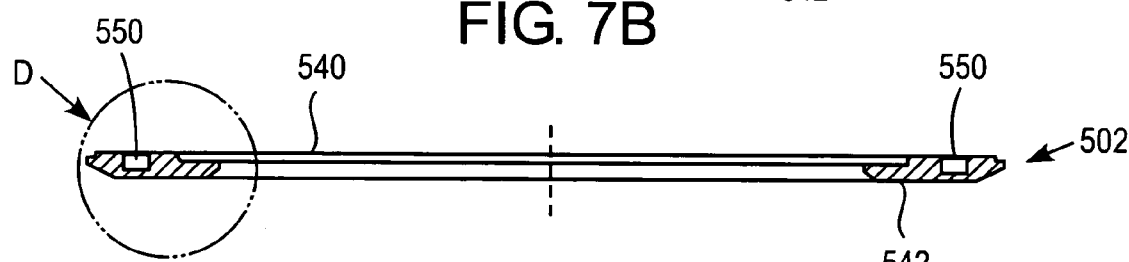
FIG. 7B
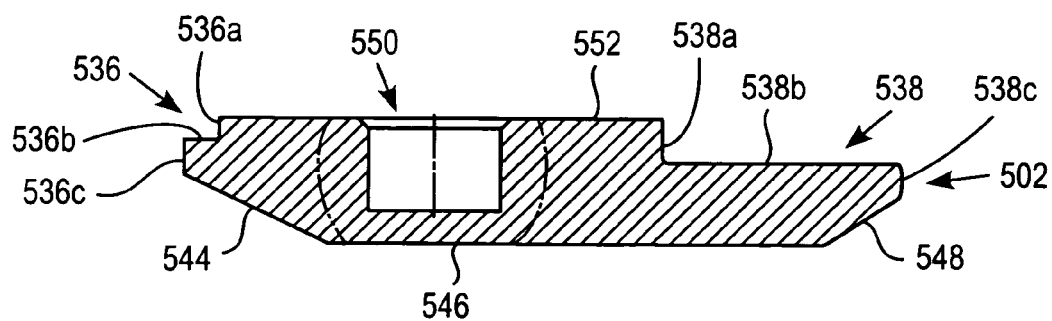
FIG. 7C
FIG. 7D

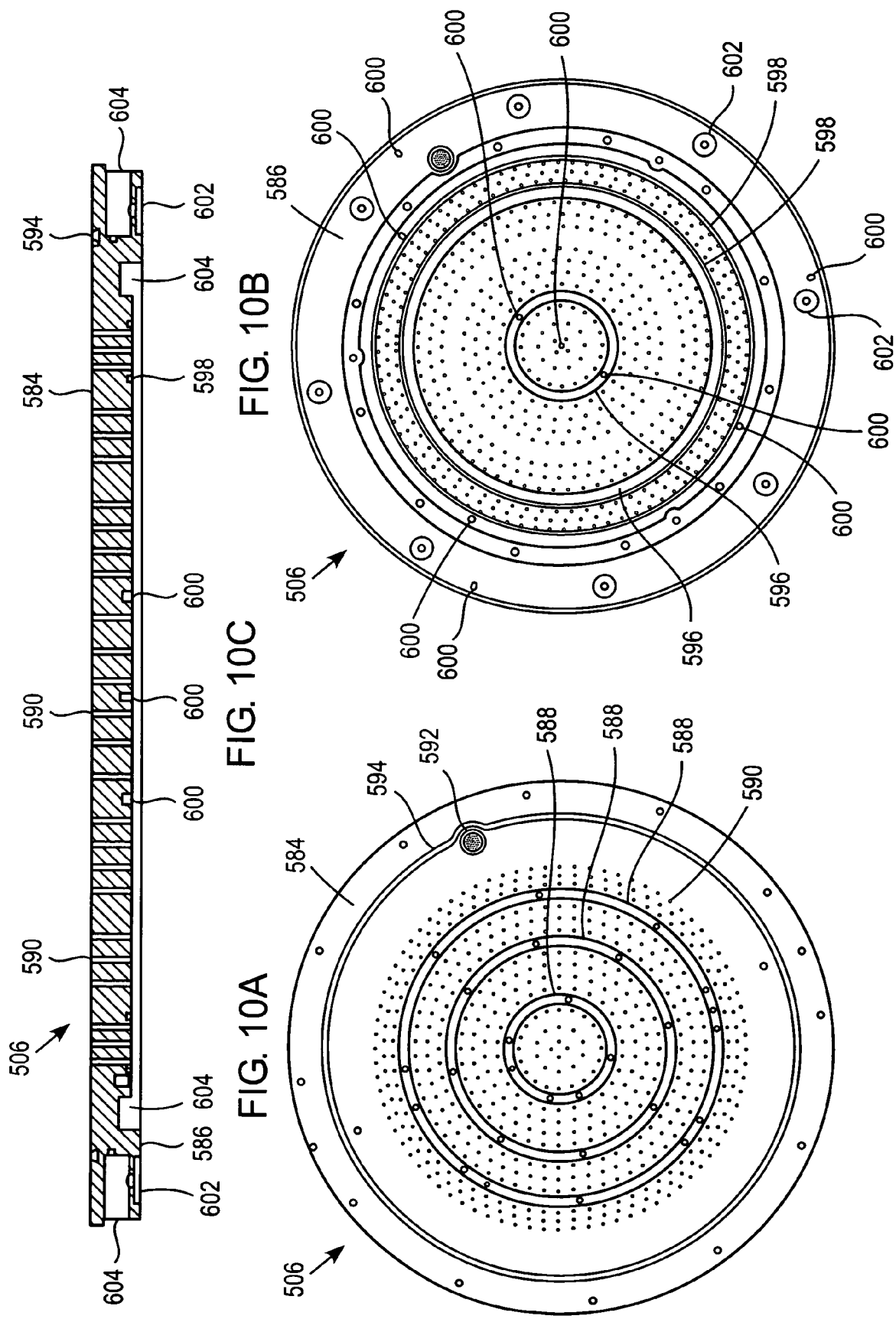

CLAMPED SHOWERHEAD ELECTRODE ASSEMBLY

FIELD OF THE INVENTION

The invention relates to a showerhead electrode assembly of a plasma processing chamber in which semiconductor components can be manufactured.

SUMMARY

According to one embodiment, a showerhead electrode assembly comprises an inner electrode and an outer electrode clamped to a backing plate wherein the showerhead electrode assembly comprises an upper electrode of a capacitively coupled plasma processing chamber. The inner electrode is a circular plate having a plasma exposed surface on a lower face thereof and a mounting surface on an upper face thereof, the lower face including inner and outer steps at an outer periphery of the plate. The inner step has a smaller diameter than the outer step and the outer step is located between the inner step and the mounting surface. The outer step is configured to mate with an inwardly extending flange of a clamp ring and the inner step is configured to mate with an inner step of the outer electrode which surrounds the inner electrode such that an inner tapered surface of the outer electrode extends from the outer edge of the plasma exposed surface. The mounting surface includes a plurality of alignment pin recesses configured to receive alignment pins arranged in a pattern matching alignment pin holes in a backing plate against which the plate is held by the clamp ring and the plate includes process gas outlets arranged in a pattern matching gas supply holes in the backing plate.

The outer electrode comprises an annular plate having a plasma exposed surface on a lower face thereof and a mounting surface on an upper face thereof, the upper face including a planar annular surface between an inner step and an outer step, the plasma exposed surface including inner and outer inclined surfaces. A plurality of circumferentially spaced apart pockets in the planar annular surface are configured to receive locking pins therein adapted to clamp the outer electrode to a backing plate.

According to another embodiment, a showerhead electrode assembly of a capacitively coupled plasma processing chamber comprises a thermal control plate, a backing plate, a guard ring, an inner electrode, an outer electrode and a clamp ring. The thermal control plate is supported by a temperature controlled wall of the plasma processing chamber, the thermal control plate having a diameter larger than a wafer to be processed in the plasma processing chamber and including annular projections on a lower face thereof with gas plenums between the annular projections. The backing plate is supported by the thermal control plate and has a diameter smaller than the thermal control plate, gas passages therethrough, and cam locks in horizontally extending bores. The guard ring surrounds the backing plate and is rotatable to align an access bore therein with at least one of the cam locks. The inner electrode has gas passages therethrough in fluid communication with the gas passages in the backing plate and an outer periphery of the inner electrode includes inner and outer steps, the outer step being located between the inner step and a surface of the inner electrode facing the backing plate. The clamp ring has an inner flange overlying the outer step of the inner electrode with an optional compression ring therebetween, the clamp ring including vertically extending stepped openings, the stepped openings being aligned with threaded holes in the backing plate and fasteners in the stepped openings attaching the clamp ring to the backing plate and applying a compressive force on the outer step of the inner electrode. The outer electrode surrounds the inner electrode and includes vertically extending locking pins which engage the cam locks, the outer electrode supporting the guard ring and being removable by releasing the locking pins from the cam locks.

BRIEF DESCRIPTION OF THE DRAWINGS

FIGS. 7A-G show details of the outer electrode.

FIGS. 10A-C show details of a backing plate.

DETAILED DESCRIPTION

Figure 1:
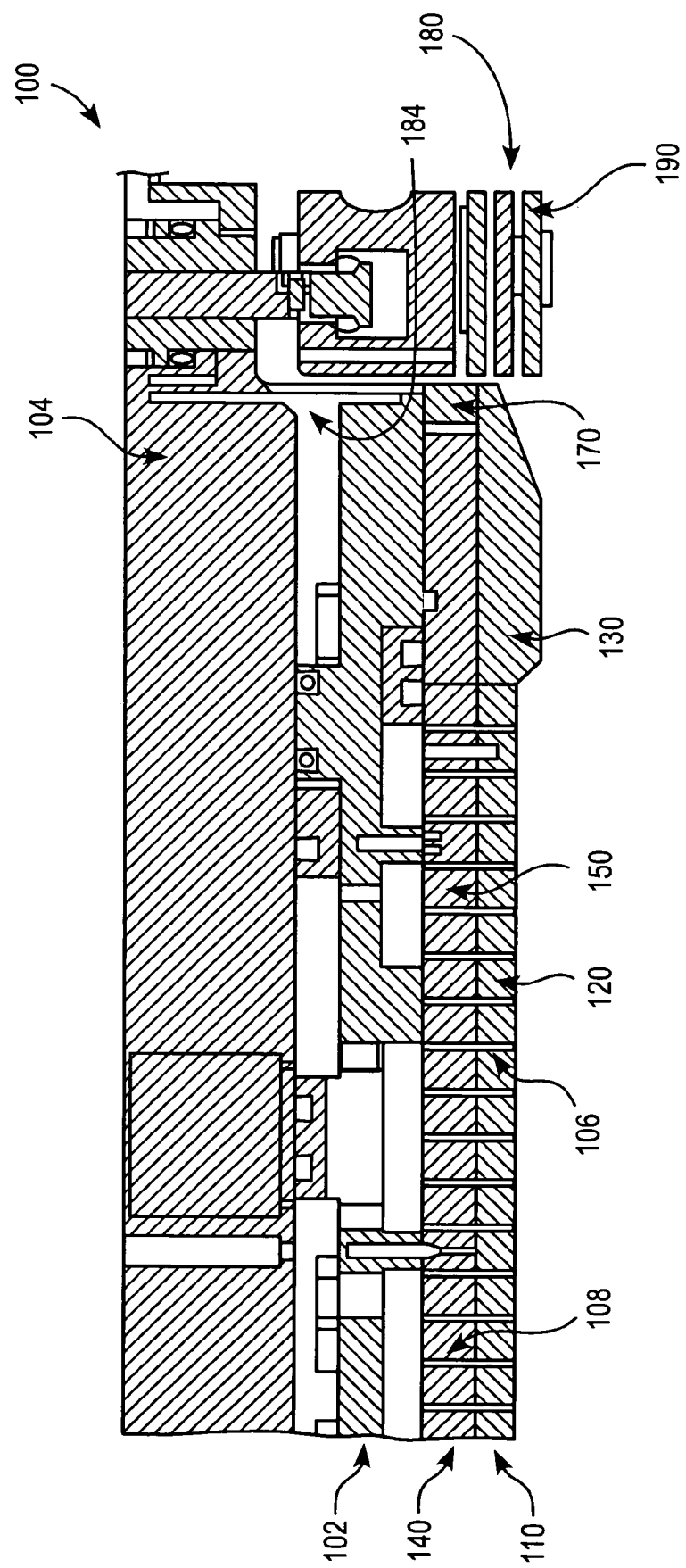
FIG. 1 shows a cross-sectional view of a showerhead electrode assembly forming an upper electrode of a capacitively coupled plasma reactor for etching substrates having a guard ring.

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls. The etching reactor electrodes may often be fabricated by bonding two or more dissimilar members with mechanically compliant and/or thermally conductive adhesives, allowing for a multiplicity of function.

FIG. 1 shows a cross-sectional view of a portion of a showerhead electrode assembly 100 of a plasma processing system for etching substrates. As shown in FIG. 1, the showerhead electrode assembly 100 includes an upper electrode 110, a backing plate 140, and a guard ring 170. The showerhead electrode assembly 100 also includes a plasma confinement assembly (or wafer area pressure (WAP) assembly) 180, which surrounds the outer periphery of the upper electrode 110 and the backing plate 140.

The assembly 100 also includes a thermal control member 102, and an upper plate 104 having liquid flow channels therein and forming a temperature controlled wall of the chamber. The upper electrode 110 preferably includes an inner electrode 120, and an outer electrode 130. The inner electrode 120 is preferably a cylindrical plate and may be made of a conductive high purity material such as single crystal silicon, polycrystalline silicon, silicon carbide or other suitable material. The backing plate 140 is mechanically secured to the inner electrode 120 and the outer electrode 130 with mechanical fasteners described below. The guard ring 170 surrounds the backing plate 140 and provides access to cam locking members as described below.

The showerhead electrode assembly 100 as shown in FIG. 1 is typically used with an electrostatic chuck (not shown) having a flat lower electrode on which a wafer is supported spaced 1 to 2 cm below the upper electrode 110. An example of such a plasma processing system is a parallel plate type reactor, such as the Exelan™ dielectric etch systems, made by Lam Research Corporation of Fremont, Calif. Such chucking arrangements provide temperature control of the wafer by supplying backside helium (He) pressure, which controls the rate of heat transfer between the wafer and the chuck.

The upper electrode 110 is a consumable part which must be replaced periodically. To supply process gas to the gap between the wafer and the upper electrode, the upper electrode 110 is provided with a gas discharge passages 106, which are of a size and distribution suitable for supplying a process gas, which is energized by the electrode and forms plasma in a reaction zone beneath the upper electrode 110.

The showerhead electrode assembly 100 also includes a plasma confinement assembly (or wafer area plasma (WAP) assembly) 180, which surrounds the outer periphery of the upper electrode 110 and the backing plate 140. The plasma confinement assembly 180 is preferably comprised of a stack or plurality of spaced-apart quartz rings 190, which surrounds the outer periphery of upper electrode 110 and the backing plate 140. During processing, the plasma confinement assembly 180 causes a pressure differential in the reaction zone and increases the electrical resistance between the reaction chamber walls and the plasma thereby confining the plasma between the upper electrode 110 and the lower electrode (not shown).

During use, the confinement rings 190 confine the plasma to the chamber volume and controls the pressure of the plasma within the reaction chamber. The confinement of the plasma to the reaction chamber is a function of many factors including the spacing between the confinement rings 190, the pressure in the reaction chamber outside of the confinement rings and in the plasma, the type and flow rate of the gas, as well as the level and frequency of RF power. Confinement of the plasma is more easily accomplished if the spacing between the confinement rings 190 is very small. Typically, a spacing of 0.15 inches or less is required for confinement. However, the spacing of the confinement rings 190 also determines the pressure of the plasma, and it is desirable that the spacing can be adjusted to achieve the pressure required for optimal process performance while maintaining plasma. Process gas from a gas supply is supplied to electrode 110 through one or more passages in the upper plate 104 which permit process gas to be supplied to a single zone or multiple zones above the wafer.

The inner electrode 120 is preferably a planar disk or plate having a uniform thickness from center (not shown) to an outer edge. The inner electrode 120 can have a diameter smaller than, equal to, or larger than a wafer to be processed, e.g., up to 300 mm, if the plate is made of single crystal silicon, which is the diameter of currently available single crystal silicon material used for 300 mm wafers. For processing 300 mm wafers, the outer electrode 130 is adapted to expand the diameter of the upper electrode 110 from about 15 inches to about 17 inches. The outer electrode 130 can be a continuous member (e.g., a single crystal silicon, polycrystalline silicon, silicon carbide or other suitable material in the form of a ring) or a segmented member (e.g., 2-6 separate segments arranged in a ring configuration, such as segments of single crystal silicon, polycrystalline silicon, silicon carbide or other material). The inner electrode 120 preferably includes multiple gas passages 106 for injecting a process gas into a space in a plasma reaction chamber below the upper electrode 110.

Single crystal silicon is a preferred material for plasma exposed surfaces of the inner electrode 120 and the outer electrode 130. High-purity, single crystal silicon minimizes contamination of substrates during plasma processing as it introduces only a minimal amount of undesirable elements into the reaction chamber, and also wears smoothly during plasma processing, thereby minimizing particles. Alternative materials including composites of materials that can be used for plasma-exposed surfaces of the upper electrode 110 include SiC, SiN, and AlN, for example.

In configurations, the showerhead electrode assembly 100 is large enough for processing large substrates, such as semiconductor wafers having a diameter of 300 mm. For 300 mm wafers, the upper electrode 110 is at least 300 mm in diameter.

However, the showerhead electrode assembly 100 can be sized to process other wafer sizes.

The backing plate 140 is preferably made of a material that is chemically compatible with process gases used for processing semiconductor substrates in the plasma processing chamber, have a coefficient of thermal expansion closely matching that of the electrode material, and/or are electrically and thermally conductive. Preferred materials that can be used to make the backing plate 140 include, but are not limited to, graphite, SiC, aluminum (Al), or other suitable materials.

The inner and the outer electrodes 120, 130 can be attached mechanically to the backing plate 140 without any adhesive bonding between the electrodes and backing plate, i.e., a thermally and electrically conductive elastomeric bonding material is not used to attach the electrodes to the backing plate.

The backing plate 140 is preferably attached to the thermal control member 102 with suitable mechanical fasteners, which can be threaded bolts, screws, or the like. For example, bolts (not shown) can be inserted in holes in the thermal control member 102 and screwed into threaded openings in the backing plate 140. The thermal control member 102 includes a flexure portion 184 and is preferably made of a machined metallic material, such as aluminum, an aluminum alloy or the like. The upper temperature controlled plate 104 is preferably made of aluminum or an aluminum alloy. The plasma confinement assembly (or wafer area plasma assembly (WAP)) 180 is positioned outwardly of the showerhead electrode assembly 100. The suitable plasma confinement assembly 180 including a plurality of vertically adjustable plasma confinement rings 190 is described in commonly owned U.S. Pat. No. 5,534,751, which is incorporated herein by reference in its entirety.

Figure 2A:
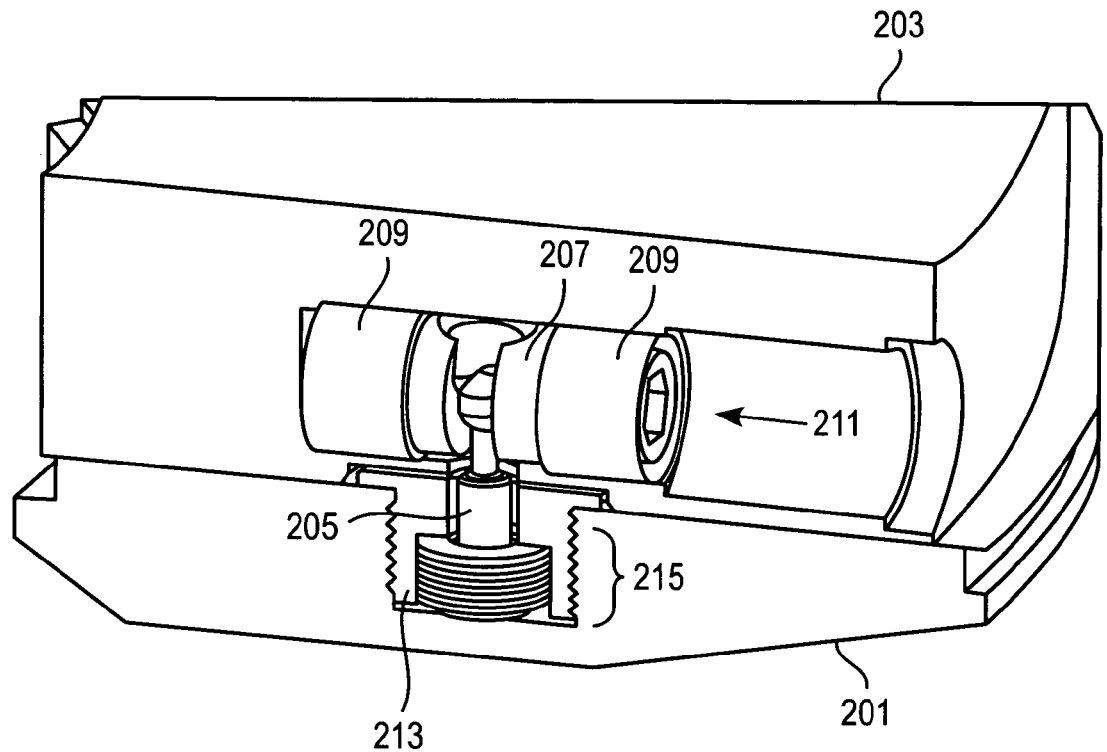
FIG. 2A is a three-dimensional representation of an exemplary cam lock for clamping an outer electrode in the reactor shown in FIG. 1.

The outer electrode can be mechanically attached to the backing plate by a cam lock mechanism as described in commonly-assigned U.S. Application Ser. No. 61/036,862, filed Mar. 14, 2008, the disclosure of which is hereby incorporated by reference. With reference to FIG. 2A, a three-dimensional view of an exemplary cam lock electrode clamp includes portions of an electrode 201 and a backing plate 203. The electrode clamp is capable of quickly, cleanly, and accurately attaching a consumable electrode 201 to a backing plate in a variety of fab-related tools, such as the plasma etch chamber shown in FIG. 1. The electrode 201 may be comprised of a variety of materials including, for example, silicon (Si), silicon carbide (SiC), or polysilicon (α-Si). The backing plate is frequently comprised of aluminum or other suitable material.

The electrode cam lock clamp includes a stud (locking pin) 205 mounted into a socket 213. The stud may be surrounded by a disc spring stack 215, such, for example, stainless steel Belleville washers. The stud 205 and disc spring stack 215 may then be press-fit or otherwise fastened into the socket 213 through the use of adhesives or mechanical fasteners. The stud 205 and the disc spring stack 215 are arranged into the socket 213 such that a limited amount of lateral movement is possible between the electrode 201 and the backing plate 203. Limiting the amount of lateral movement allows for a tight fit between the electrode 201 and the backing plate 203, thus ensuring good thermal contact, while still providing some movement to account for differences in thermal expansion between the two parts. Additional details on the limited lateral movement feature are discussed in more detail, below.

In a specific exemplary embodiment, the socket 213 is fabricated from bearing-grade Torlon®. Alternatively, the socket 213 may be fabricated from other materials possessing certain mechanical characteristics such as good strength and impact resistance, creep resistance, dimensional stability, radiation resistance, and chemical resistance may be readily employed. Various materials such as polyamides, polyimides, acetals, and ultra-high molecular weight polyethylene materials may all be suitable. High temperature-specific plastics and other related materials are not required for forming the socket 213 as 230° C. is a typical maximum temperature encountered in applications such as etch chambers. Generally, a typical operating temperature is closer to 130° C.

Other portions of the electrode cam lock clamp are comprised of a camshaft 207 surrounded at each end by a pair of camshaft bearings 209. The camshaft 207 and camshaft bearing assembly is mounted into a backing plate bore 211 machined into the backing plate 203. In a typical application for an etch chamber designed for 300 mm semiconductor wafers, eight or more of the electrode clamps may be spaced around the periphery of the electrode 201/backing plate 203 combination.

The camshaft bearings 209 may be machined from a variety of materials including Torlon®, Vespel®, Celcon®, Delrin®, Teflon®, Arlon®, or other materials such as fluoropolymers, acetals, polyamides, polyimides, polytetrafluoroethylenes, and polyetheretherketones (PEEK) having a low coefficient of friction and low particle shedding. The stud 205 and camshaft 207 may be machined from stainless steel (e.g., 316, 316L, 17-7, etc.) or any other material providing good strength and corrosion resistance.

Figure 2B:
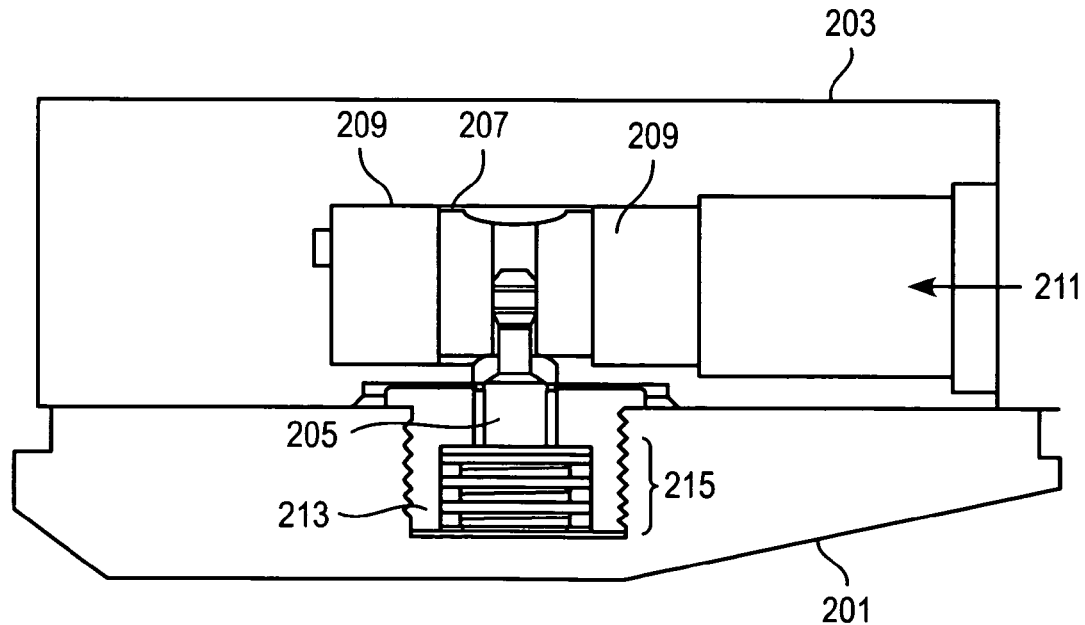
FIG. 2B is a cross-sectional view of the exemplary cam lock electrode clamp of FIG. 2A.

Referring now to FIG. 2B, a cross-sectional view of the electrode cam clamp further exemplifies how the cam clamp operates by pulling the electrode 201 in close proximity to the backing plate 203. The stud 205/disc spring stack 215/socket 213 assembly is mounted into the electrode 201. As shown, the assembly may be screwed, by means of external threads on the socket 213 into a threaded pocket in the electrode 201. However, the socket may be mounted by adhesives or other types of mechanical fasteners as well.

Figure 3:
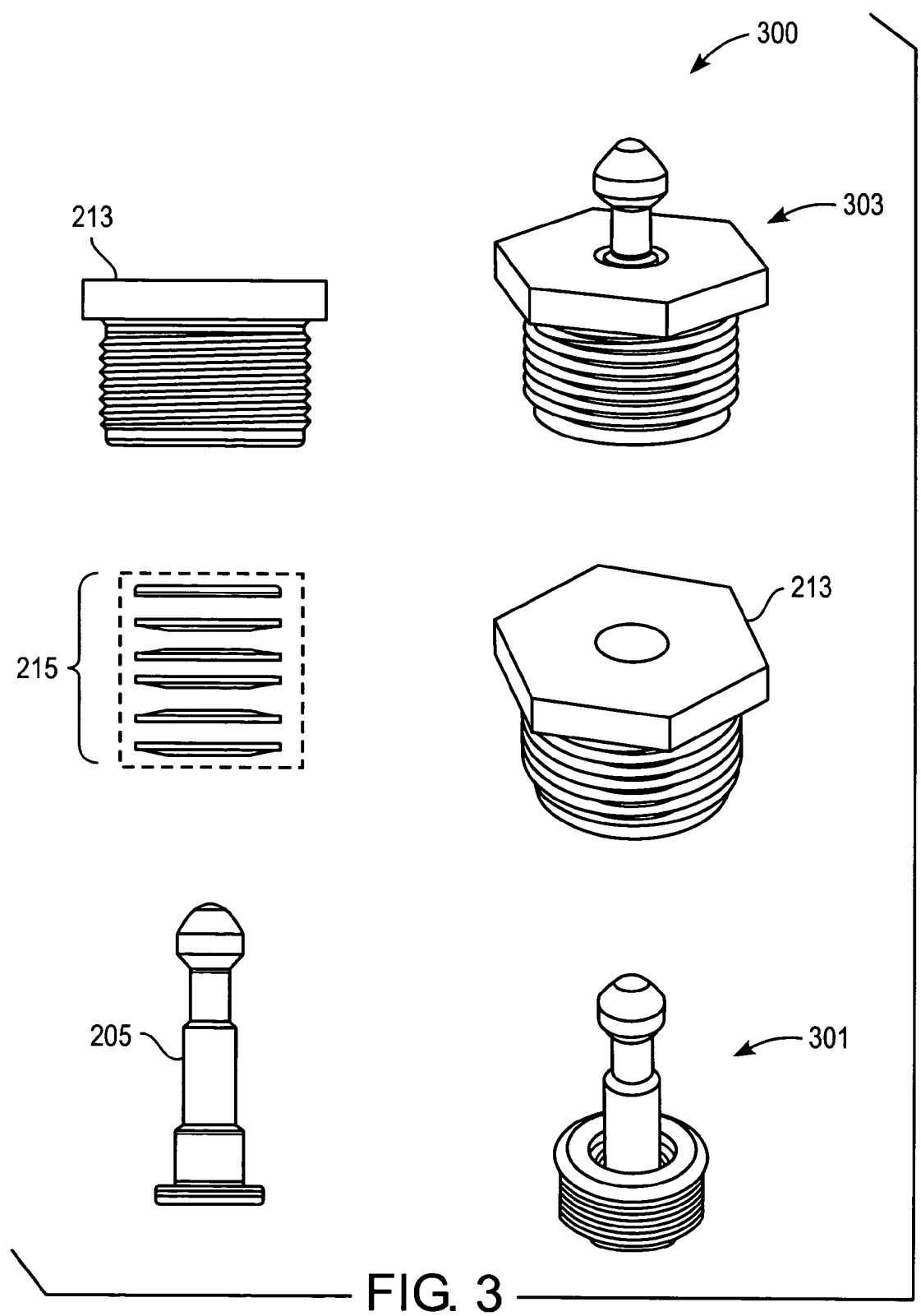
FIG. 3 shows side-elevation and assembly drawings of an exemplary stud used in the cam lock clamp of FIGS. 2A and 2B.

In FIG. 3, an elevation and assembly view 300 of the stud 205 having an enlarged head, disc spring stack 215, and socket 213 provides additional detail into an exemplary design of the cam lock electrode clamp. In a specific exemplary embodiment, a stud/disc spring assembly 301 is press fit into the socket 213. The socket 213 has an external thread and a hexagonal top member allowing for easy insertion into the electrode 201 (see FIGS. 2A and 2B) with light torque (e.g., in a specific exemplary embodiment, about 20 inch-pounds). As indicated above, the socket 213 may be machined from various types of plastics. Using plastics minimizes particle generation and allows for a gall-free installation of the socket 213 into a mating pocket on the electrode 201.

The stud/socket assembly 303 illustrates an inside diameter in an upper portion of the socket 213 being larger than an outside diameter of a mid-section portion of the stud 205. The difference in diameters between the two portions allows for the limited lateral movement in the assembled electrode clamp as discussed above. The stud/disc spring assembly 301 is maintained in rigid contact with the socket 213 at a base portion of the socket 213 while the difference in diameters allows for some lateral movement. (See also, FIG. 2B.)

Figure 4A:
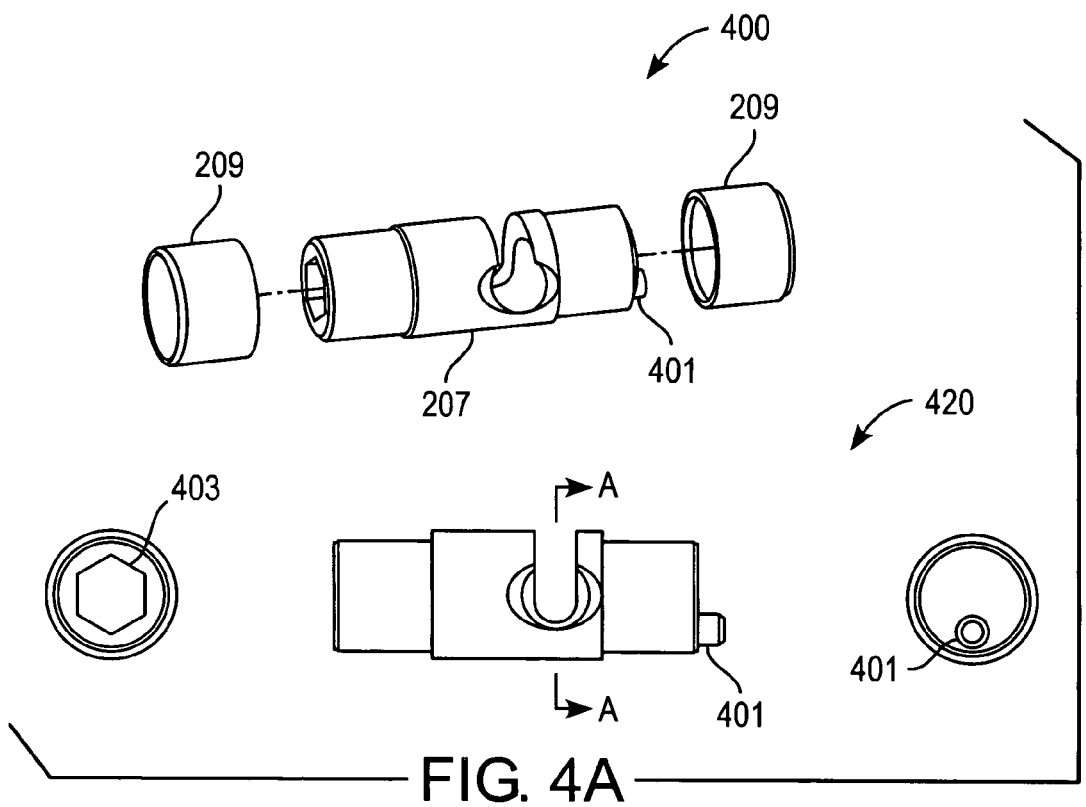
FIG. 4A shows side-elevation and assembly drawings of an exemplary cam shaft used in the cam lock clamp of FIGS. 2A and 2B.

With reference to FIG. 4A, an exploded view 400 of the camshaft 207 and camshaft bearings 209 also indicates a keying pin 401. The end of the camshaft 207 having the keying pin 401 is first inserted into the backing plate bore 211 (see FIG. 2B). A pair of small mating holes (not shown) at a far end of the backing plate bore 211 provide proper alignment of the camshaft 207 into the backing plate bore 211. A side-elevation view 420 of the camshaft 207 clearly indicates a possible placement of a hex opening 403 on one end of the camshaft 207 and the keying pin 401 on the opposite end.

For example, with continued reference to FIGS. 4A and 2B, the electrode cam clamp is assembled by inserting the camshaft 207 into the backing plate bore 211. The keying pin 401 limits rotational travel of the camshaft 207 in the backing plate bore 211 by interfacing with one of the pair of small mating holes. The camshaft may first be turned in one direction though use of the hex opening 403, for example, counterclockwise, to allow entry of the stud 205 into the camshaft 207, and then turned clockwise to fully engage and lock the stud 205. The clamp force required to hold the electrode 201 to the backing plate 203 is supplied by compressing the disc spring stack 215 beyond their free stack height. The camshaft 207 has an internal eccentric internal cutout which engages the enlarged head of the shaft 205. As the disc spring stack 215 compresses, the clamp force is transmitted from individual springs in the disc spring stack 215 to the socket 213 and through the electrode 201 to the backing plate 203.

In an exemplary mode of operation, once the camshaft bearings are attached to the camshaft 207 and inserted into the backing plate bore 211, the camshaft 207 is rotated counterclockwise to its full rotational travel. The stud/socket assembly 303 (FIG. 3) is then lightly torqued into the electrode 201. The head of the stud 205 is then inserted into the vertically extending through hole below the horizontally extending backing plate bore 211. The electrode 201 is held against the backing plate 203 and the camshaft 207 is rotated clockwise until either the keying pin drops into the second of the two small mating holes (not shown) or an audible click is heard (discussed in detail, below). The exemplary mode of operation may be reversed to dismount the electrode 201 from the backing plate 203.

Figure 4B:
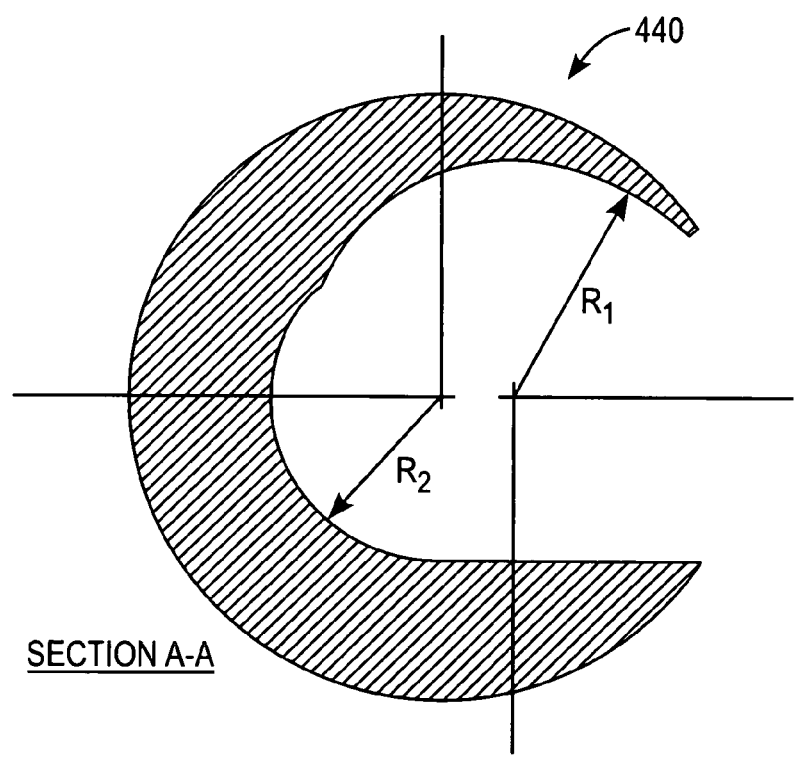
FIG. 4B shows a cross-sectional view of an exemplary cutter-path edge of a portion of the cam shaft of FIG. 4A.

With reference to FIG. 4B, a sectional view A-A of the side-elevation view 420 of the camshaft 207 of FIG. 4A indicates a cutter path edge 440 by which the head of the stud 205 is fully secured. In a specific exemplary embodiment, the two radii $R_1$ and $R_2$ are chosen such that the head of the stud 205 makes the audible clicking noise described above to indicate when the stud 205 is fully secured.

Figure 5A:
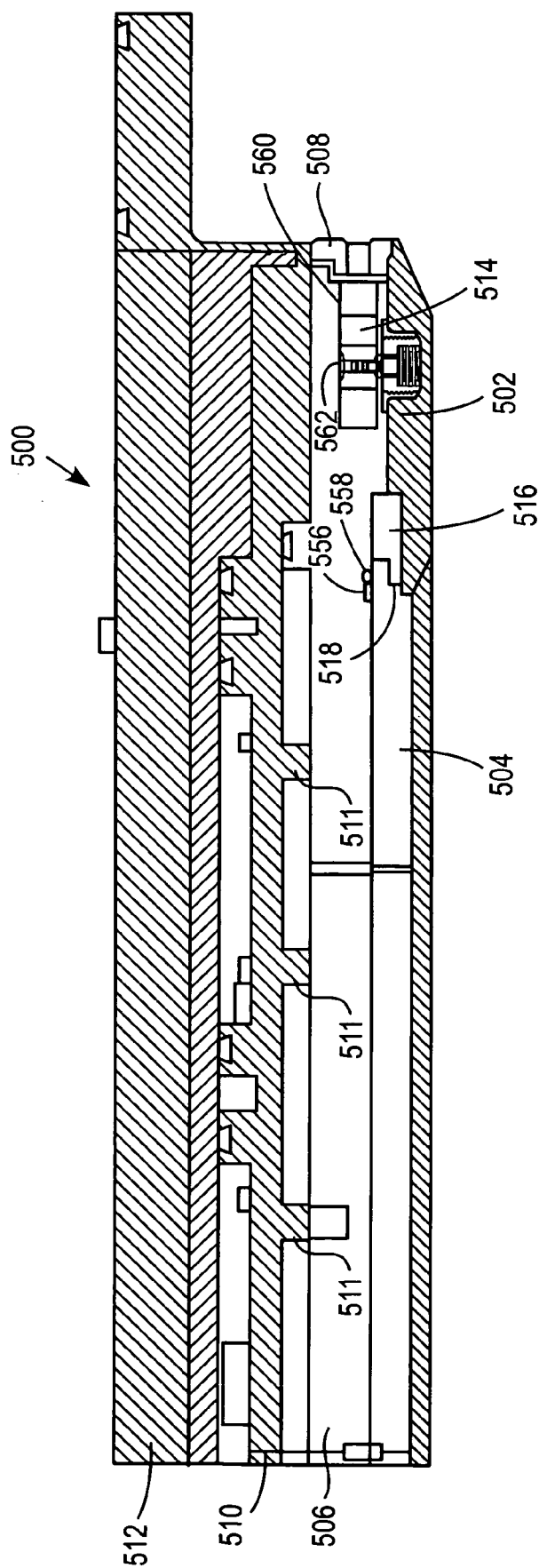
FIG. 5A shows a cross-section of the showerhead electrode assembly with inner and outer electrodes mechanically clamped to a backing plate.
Figure 5B:
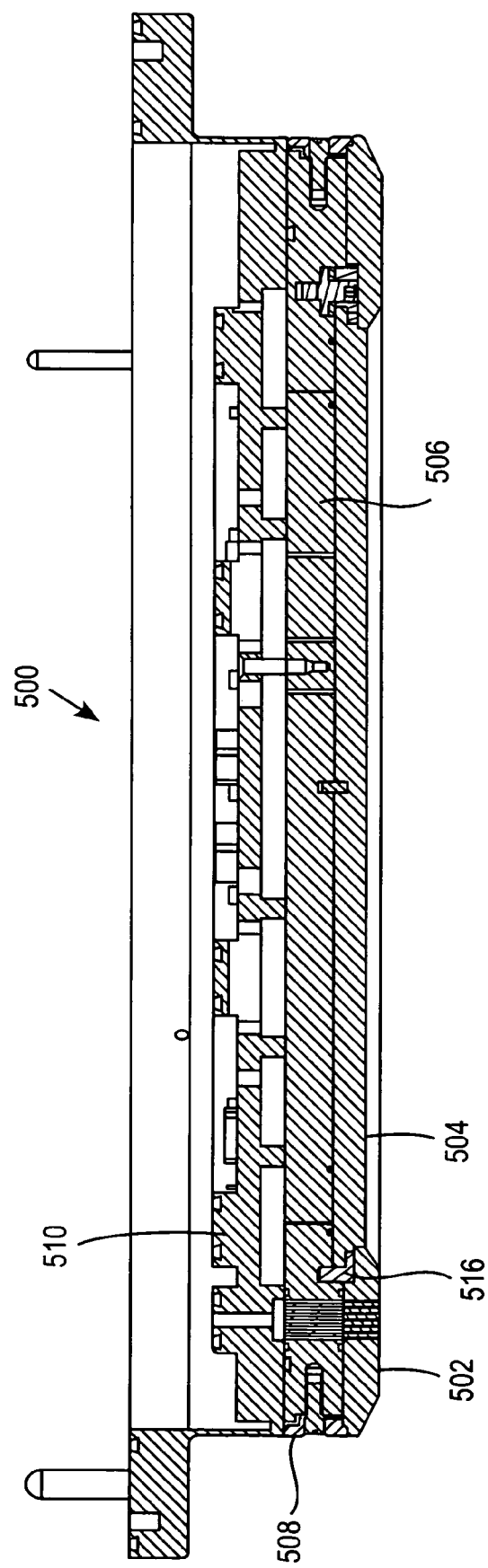
FIG. 5B shows a cross-section of the showerhead electrode at a different location and FIG. 5C is an enlarged view of a portion of FIG. 5B.
Figure 5C:
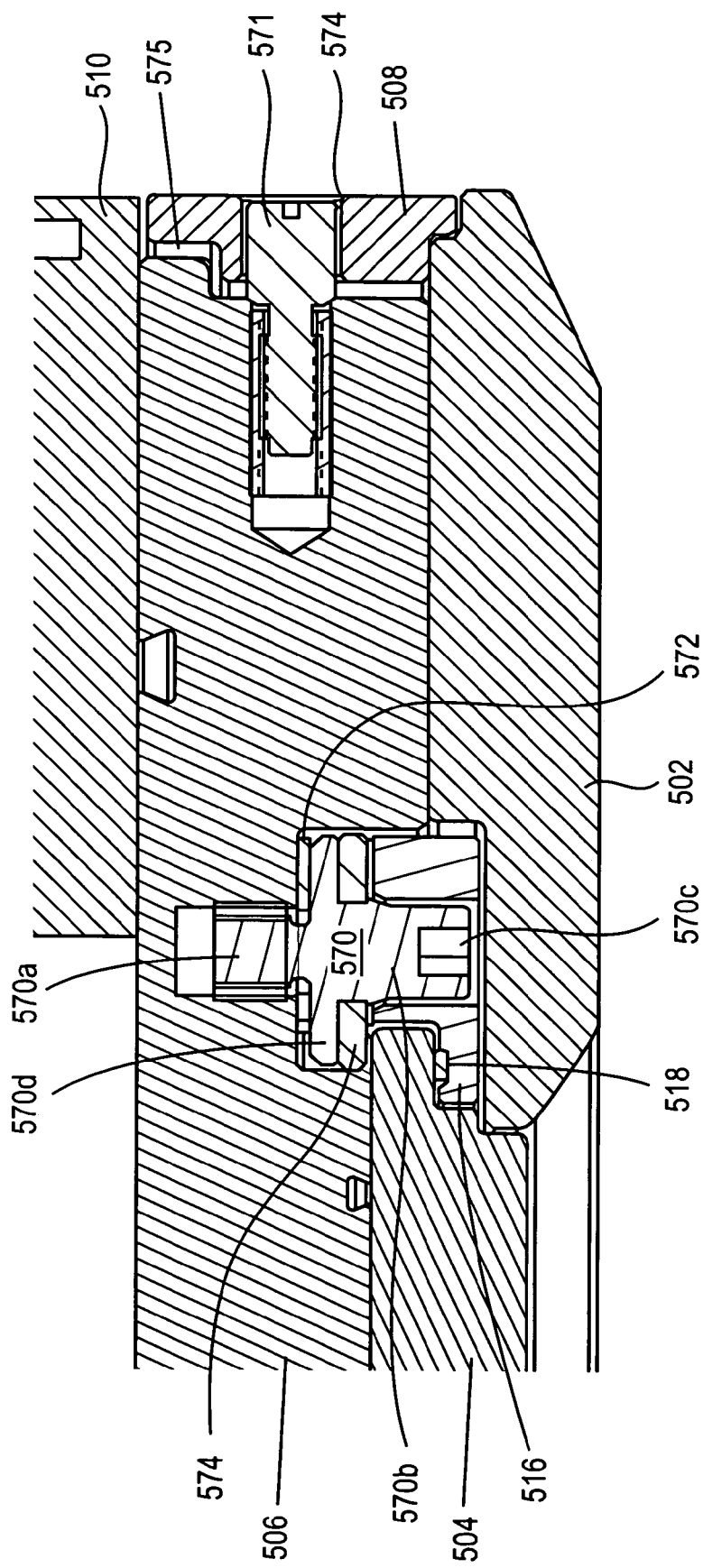

FIG. 5A is a cross-section of an upper electrode assembly 500 for a capacitively coupled plasma chamber which includes the following features: (a) a cam-locked non-bonded outer electrode 502; (b) a clamped non-bonded inner electrode 504; (c) a backing plate 506; and (d) a guard ring 508 which allows access to cam locks holding the outer electrode to the backing plate 506. FIG. 5B is a cross-section of the electrode assembly at a different location and FIG. 5C is an enlarged view of a portion of FIG. 5B showing details of a jackscrew arrangement for detaching the inner electrode from the backing plate.

The electrode assembly 500 includes a thermal control plate 510 bolted from outside the chamber to a temperature controlled top wall 512 of the chamber. The outer electrode is releasably attached to the backing plate by cam locks 514 described earlier with reference to FIGS. 2-4. The inner electrode is clamped to the thermal control plate by a clamp ring 516. The clamp ring includes a series of holes which receive fasteners such as bolts (screws) threaded into threaded openings in an underside of the backing plate 506. To avoid contact of the clamp ring with a step on an outer edge of the inner electrode, a compression ring 518 of stiff material such as a hard polyimide material such as CIRLEX is compressed in a space between opposed surfaces of the inner electrode and the clamp ring.

In a preferred embodiment, the outer electrode 502 of the electrode assembly 500 can be disassembled by (a) rotating the guard ring 508 to a first position aligning four holes in the guard ring with four cam locks 514 located at spaced positions in the outer portion of the backing plate; (b) inserting an Allen wrench through each hole in the guard ring and rotating each cam lock to release a vertically extending locking pin of each respective cam lock; (c) rotating the guard ring 90° to a second position aligning the four holes in the guard ring with another four cam locks; and (d) inserting an Allen wrench through each hole in the guard ring and rotating each respective cam lock to release a locking pin of each respective cam lock; whereby the outer electrode 502 can be lowered and removed from the plasma chamber.

FIG. 5A also shows a cross-sectional view of one of the cam lock arrangements wherein a rotatable cam lock 514 is located in a horizontally extending bore 560 in an outer portion of the backing plate 506. The cylindrical cam lock 514 is rotatable by a tool such as an Allen wrench to a lock position at which an enlarged end of a locking pin 562 is engaged by a cam surface of the cam lock 514 which lifts the enlarged head of the locking pin or a release position at which the locking pin 562 is not engaged by the cam lock 514. The backing plate includes vertically extending bores through which the locking pins are inserted to engage the cam locks.

FIG. 5B illustrates a cross-section of the electrode assembly at a position passing through a jackscrew 570 and an insert 571 which fills an access opening 574 in guard ring 508 and threads into a threaded hole in the backing plate to prevent the guard ring from rotating. Preferably, three jackscrews 570 of suitable material such as stainless steel are arranged at 120° apart to facilitate removal of the inner electrode. The insert 571 is preferably a polymer or ceramic screw which threads into a threaded opening in backing plate 506. An outer step on the outer electrode engages a mating step on the guard ring and maintains an annular gap 575 between the outer periphery of the backing plate 506 and an inner periphery of the guard ring 508. The jackscrew 570 includes an upper threaded shaft 570a received in a threaded opening in the backing plate 506, a lower shaft 570b having a keyed opening 570c for engaging a tool such as an Allen wrench, and an annular flange 570d intermediate the upper and lower shafts. A polymer ring 572 such as a CIRCLEX ring bears against opposed surfaces of the backing plate 506 and esch flange 570d and polymer washers 573 such as TEFLON washers bear against the lower surfaces of each of the flanges 570d and opposed surfaces of inner electrode 504 and clamp ring 516. In a preferred embodiment, the polymer ring 572 is about 0.031 inch thick and about 0.5 inch wide with 12 holes to receive the fasteners holding the clamp ring to the backing plate and 3 holes to receive the shafts 570a of the jackscrews. The backing plate 506 includes openings which extend partially under the outer edge of the inner electrode and each has a depth sufficient to receive a respective flange 570d and washer 573. The polymer ring 572 is received in an annular channel in the backing plate. During disassembly of the inner electrode from the backing plate, the jackscrews are rotated in a direction which causes the flange 570d to move towards the upper face of the inner electrode to thereby overcome potential sticking of the inner electrode to the backing plate due to thermal interface rings, O-rings or the like interposed therebetween.

FIGS. 6A-D show details of the inner electrode 504. The inner electrode 504 is preferably a plate of high purity (less than 10 ppm impurities) low resistivity (0.005 to 0.02 ohmcm) single crystal silicon with alignment pin holes 520 in an upper face (mounting surface) 522 which receive alignment pins 524 of polymer material such as TORLON 5030 and steps in an outer edge 526 which mate with the clamp ring 516 and an inner lip of the outer electrode 502. Gas holes 528 of suitable diameter and/or configuration (e.g., 0.017 inch diameter holes) extend from the upper face to the lower face (plasma exposed surface) 530 and can be arranged in any suitable pattern. In the embodiment shown, the gas holes are arranged in 13 circumferentially extending rows with 4 gas holes in the first row located about 0.25 inch from the center of the electrode, 10 gas holes in the second row located about 0.7 inch from the center, 20 gas holes in the third row located about 1.25 inches from the center, 26 gas holes in the fourth row located about 1.95 inches from the center, 30 gas holes in the fifth row located about 2.3 inches from the center, 36 gas holes in the sixth row located about 2.7 inches from the center, 40 gas holes in the seventh row located about 3.05 inches from the center, 52 gas holes in the eighth row located about 3.75 inches from the center, 58 gas holes in the ninth row located about 4.1 inches from the center, 62 gas holes in the tenth row located about 4.5 inches from the center, 70 gas holes in the eleventh row located about 5.2 inches from the center, 74 gas holes in the twelfth row located about 5.45 inches from the center and 80 holes in the thirteenth row located about 5.75 inches from the center.

The upper face of the electrode includes 6 alignment pin holes 520 with 3 pin holes near the center and 3 pin holes near the outer edge of the electrode. The pin holes can have diameters of about 0.116 inch. The 3 central pin holes are radially aligned and include a pin hole about 0.160 inch deep at the center of the inner electrode and 2 pin holes about 0.200 inch deep located about 1.6 inches from the center pin hole at locations between the third and fourth row of gas holes. The outer pin holes are about 0.100 inch deep and include one pin hole radially aligned with the central pin holes about 6 inches from the center pin hole and two other pin holes offset 97.5° and 170° therefrom with the second and the third outer pin holes the same distance from the center pin hole but offset 92.5° from each other.

The outer steps include an inner step 532 and an outer step 534 machined into the silicon plate so as to extend completely around the silicon plate. In a preferred embodiment, the silicon plate has a thickness of about 0.400 inch and an outer diameter of about 12.560 inch, the inner step 532 has an inner diameter of about 12.004 inches, an outer diameter of about 12.135 inch and extends about 0.13 inch into the plasma exposed surface 530 and the outer step 534 has an inner diameter of about 12.135 inches and an outer diameter of about 12.560 inches and extends about 0.24 inch into the plasma exposed surface 530. The inner step 532 has a vertical surface 532a about 0.13 inch long and a horizontal surface 532b about 0.065 inch long and the outer step 534 has a vertical surface 534a about 0.11 inch long and a horizontal surface 534b about 0.218 inch long.

Figure 6B:
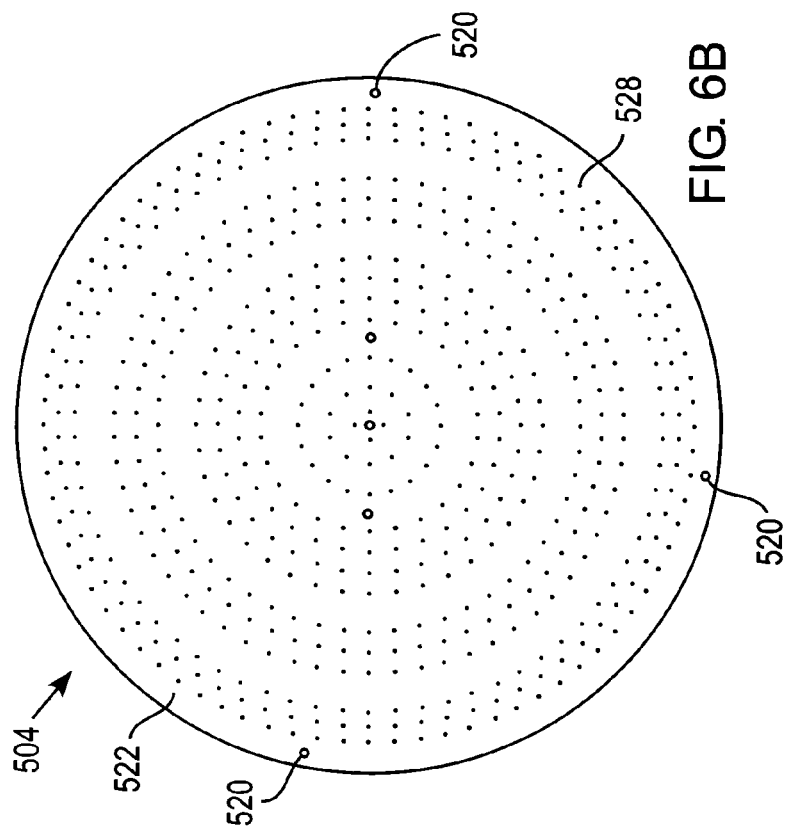
FIGS. 6A-D show details of the inner electrode.
Figure 6D:
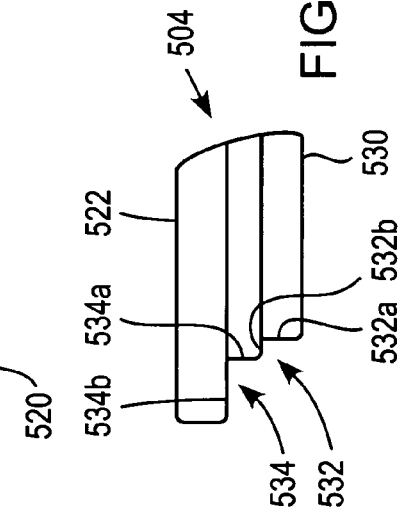
Figure 6A:
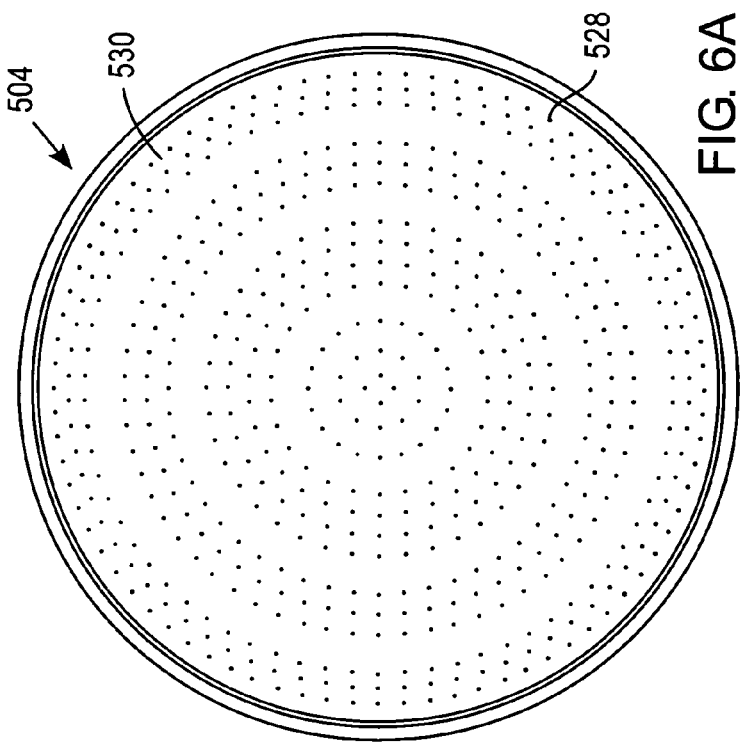
Figure 6C:
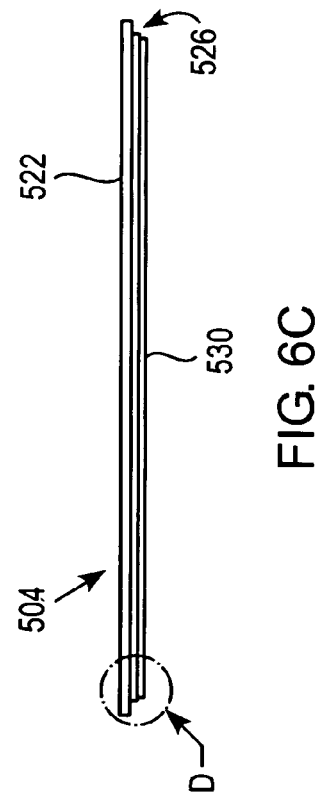

FIG. 6A shows a front planar view showing the plasma exposed surface 530 of the inner electrode 504 with the 13 rows of gas holes. FIG. 6B shows a front planar view of the upper face 522 with the 13 rows of gas holes and 6 pin holes 520. FIG. 6C shows a side view with the inner step closest to the plasma exposed surface and the outer step closest to the upper face of the inner electrode. FIG. 6D shows an enlarged view of detail D of FIG. 6C showing the inner and outer steps with 6 rounded corners provided at the outer edge of the upper face 522, the outer edge of the lower face 530 and transitions between the horizontal and vertical surfaces 532a, 532b, 534a, 534b with corners of each other and the upper and lower faces 522, 530 (e.g., rounded with a 0.025 inch radius).

The outer electrode 502 includes an outer step 536 which supports the guard ring 508, an inner step 538 which overlies the clamp ring and the inner step of the inner electrode, an upper face (mounting surface) 540 which engages a lower surface of the backing plate 506, a lower face (plasma exposed stepped surface) 542 which includes inner tapered surface 544, a horizontal surface 546, and an outer tapered surface 548 and 8 pockets 550 in upper face 540 in which the locking pins are mounted.

Figure 7E:
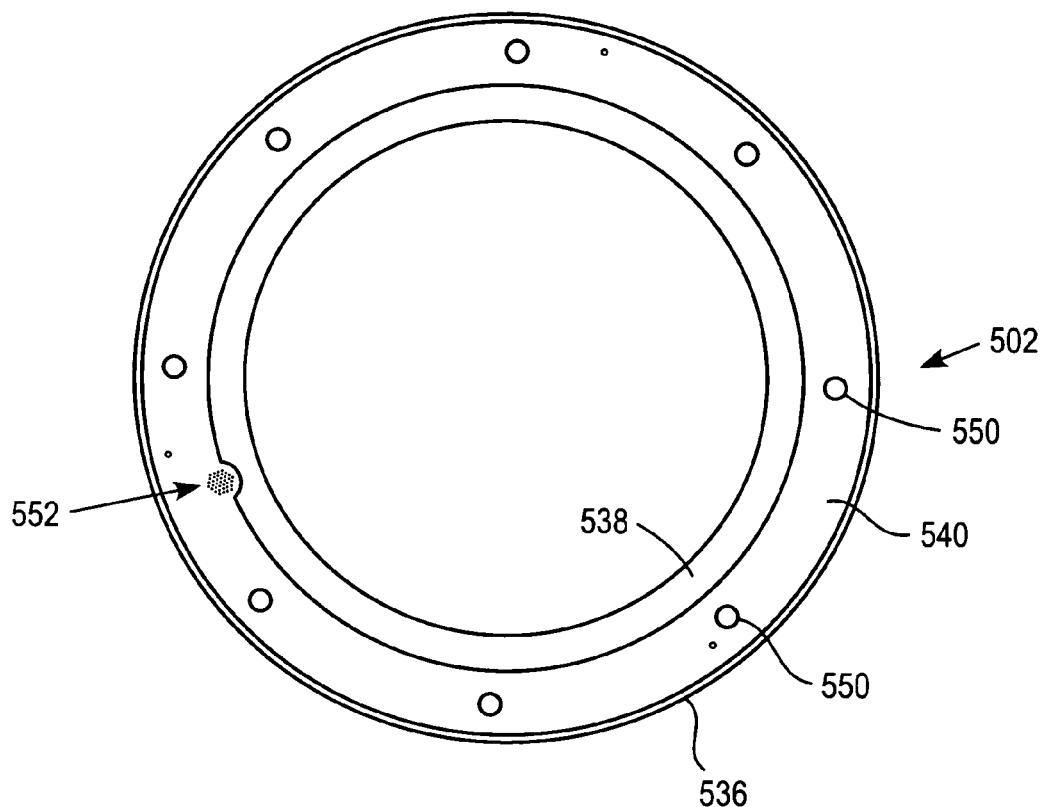

FIGS. 7A-G show various views of the outer electrode. FIG. 7A shows a top plan view of the plasma exposed surface 542 of the outer electrode 502 and FIG. 7B shows a side view of the outer electrode. The outer electrode is an annular ring with inner and outer tapered surfaces 544, 548 and a horizontal surface 546 therebetween forming the plasma exposed surface 542. The outer electrode is preferably a single piece of high purity low resistivity single crystal silicon or high purity polycrystalline silicon. Alternatively, the outer electrode can be made up of segments of high purity single or polycrystalline silicon. FIG. 7C shows a cross section through the entire outer electrode and FIG. 7D shows a blowup of detail D in FIG. 7C. In a preferred embodiment, the outer electrode has an outer diameter of about 17 inches and an inner diameter of about 12.024 inches. The horizontal surface 546 extends radially about 1.709 inches from its inner diameter of about 12.552 inches to its outer diameter of about 15.97 inches. The upper face of the outer electrode includes an inner step 538 and an outer step 536 with a planar annular horizontal mounting surface 552 extending therebetween. The mounting surface 552 has an inner diameter of about 13.655 inches and an outer diameter of about 16.752 inches. Two of the 8 pockets 550 which receive the locking pins are illustrated in FIG. 7C.

FIG. 7D shows details of a preferred embodiment of the inner and outer tapered surfaces 544, 548 and the inner and outer steps 536, 538 on the outer electrode 502 wherein the tapered surfaces form angles of 20 to 40° with the horizontal plasma exposed surface 546. More preferably, the inner tapered surface 544 is at an angle of 34.3° and the outer tapered surface 548 is at an angle of 24.9°. The inner step 538 includes a vertical surface 538a having a height of about 0.145 inch and a horizontal surface 538b extending radially about 0.825 inch. The outer step 536 includes a vertical surface 536a having a height of 0.076 inch and a horizontal surface 536b extending radially about 0.124. An inner vertical surface 538c between the inner step 538 and inner tapered surface 548 has a height of about 0.115 inch. An outer vertical surface 536c between the outer step 536 and the outer tapered surface 544 has a height of about 0.125 inch. The pocket 550 for the locking pin has a depth of about 0.325 inch and the total thickness of the outer electrode is about 0.440 inch. The pocket can be a 0.5 inch wide threaded hole to receive a threaded mounting base (socket 213 described in FIGS. 2-3) of the locking pin. The entrance to the pocket can include a taper and the bottom of the pocket can include an unthreaded thread relief section having a maximum length of 0.040 inch. All corners of the inner and outer steps and inner and outer tapered surfaces are rounded (e.g., rounded with a 0.025 inch radius).

Figure 7F:
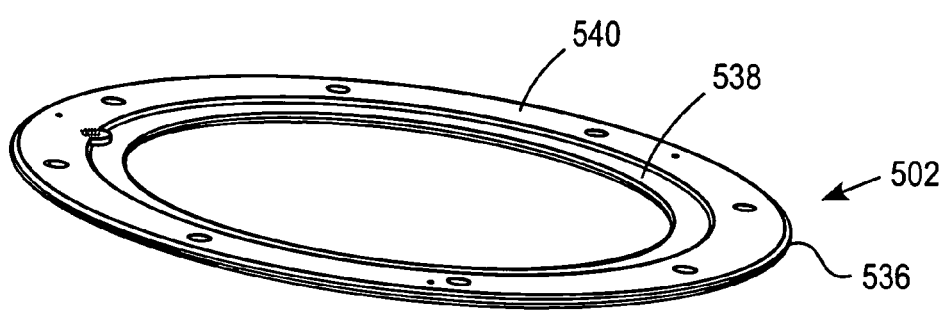
Figure 7G:
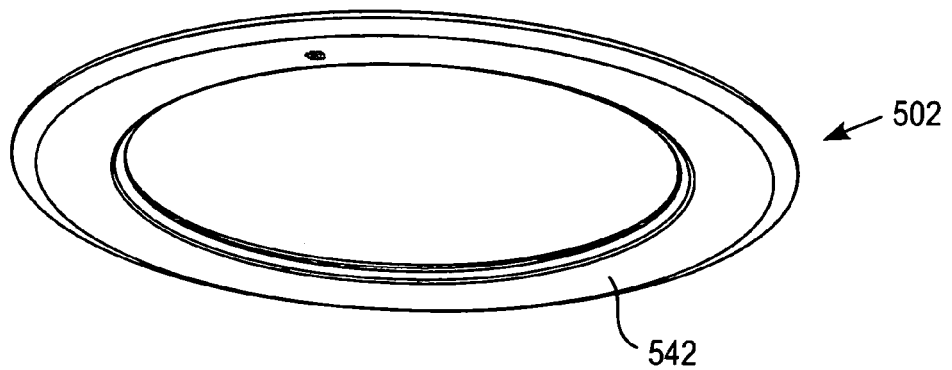

FIG. 7E shows a top plan view of the upper face 540 of the outer electrode 502 wherein the positions of the 8 pockets 550 for receipt of the 8 locking pins with centers of the pockets located about 15.244 inches apart. Also illustrated is a group of 37 holes 552 (which communicate with vacuum pressure sensing equipment such as a manometer) having diameters of about 0.025 inch arranged in 7 rows about 0.07 inch apart forming hexagonal pattern of holes at a portion of the mounting surface 540 which extends along a radius of about 0.480 inch slightly into the inner step. Three alignment pin holes 554 having diameters of about 0.116 inch and depths of 0.200 inch are spaced 120° apart at locations in the mounting surface near the outer periphery thereof. FIG. 7F is a perspective view showing the upper face and FIG. 7G is a perspective view showing the lower face of the outer electrode 502.

The clamp ring 516 is bolted into the backing plate 506 and presses against a polymer compression ring 518 of high hardness. The polymer ring 518 presses against the outer step 534 of the inner electrode 504 and the inner step 538 of the outer electrode 502 fits over the clamp ring 516 and fits within the inner step 534 of the inner electrode with the inner tapered surface 544 extending from the planar exposed surface of the inner electrode 504. The mounting surface 540 of the outer electrode abuts an opposed surface of the backing plate 506 as a result of the clamping force exerted by the 8 locking pins held by the 8 cam locks in the backing plate. The guard ring 508 covers the mounting holes in the backing plate 506 and the access openings 524 in the guard ring are filled with removable inserts 571 made of plasma resistant polymer material such as Torlon®, Vespel®, Celcon®, Delrin®, Teflon®, Arlon®, or other materials such as fluoropolymers, acetals, polyamides, polyimides, polytetrafluoroethylenes, and polyetheretherketones (PEEK) having a low coefficient of friction and low particle shedding.

With reference to FIG. 5, electrical contact between the backing plate 506 and inner electrode 504 is provided by one or more thermal interface materials (TIM) and/or Q-pads 556 located at the outer periphery of the inner electrode and at one or more locations between the central alignment pin and the outer Q-pad. Such TIM can be rings of polymer laminates containing electrically conductive material, e.g., Geltec interface material COH-4000, COH-2003, RE-10, COH-1002, DP-100, DP-200 or DP-300 can be used with thicknesses of 0.5 mm, 1.0 mm, 2.0 mm or 3.0 mm, preferably 0.012 or 0.020 inch thickness and 0.31 inch width. For example, TIM rings or Q-pads can be located at distances of about 2 inches and 6 inches from the center of the inner electrode. To provide different process gas mixtures and/or flow rates, one or more optional gas partition seals can be provided between the center alignment pin and the outer Q-pad. For example, a single O-ring can be provided between the inner electrode 504 and the backing plate 506 at a location between the inner and outer Q-pads to separate an inner gas distribution zone from an outer gas distribution zone. An O-ring 558 located between the inner electrode 504 and the backing plate 506 along the inner periphery of the outer Q-pad can provide a gas and particle seal between the inner electrode and backing plate.

FIGS. 8A-D show details of clamp ring 516 having a thickness of 0.419 inch, an outer diameter of about 13.575 inches, an inner diameter of about 12.590 inches and a flange extending about 0.212 inch from the inner diameter. The clamp ring 516 includes a radially inward extending flange 564 which mates with the outer step 534 on the inner electrode 504. Twelve stepped bores 566 passing through upper and lower surfaces of the clamp ring receive fasteners such as screws, bolts or other suitable mechanical fastening elements which thread into threaded openings in the backing plate 506. A compression ring 518 between the flange 564 and the opposed surface of the inner electrode 504 protects the inner electrode from galling of the Al backing plate breaking upon tightening of the screws. The ring is preferably of CIRLEX with a rectangular cross-section with dimension of about 0.031 inch thickness and 0.071 inch width. The flange 564 can include a rectangular groove for receiving the compression ring 518. For example, the groove can have a width of about 0.10 inch and depth of about 0.01 inch.

Figure 8A:
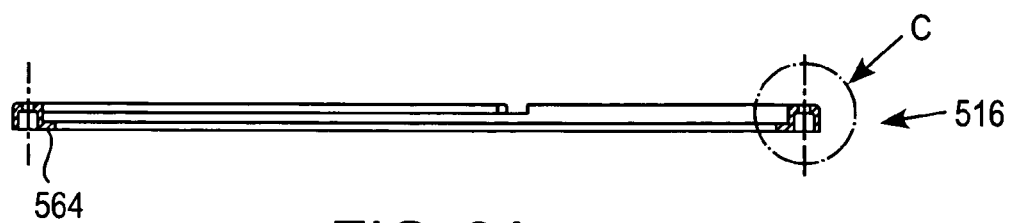
FIGS. 8A-D show details of a clamp ring which clamps the inner electrode.
Figure 8B:
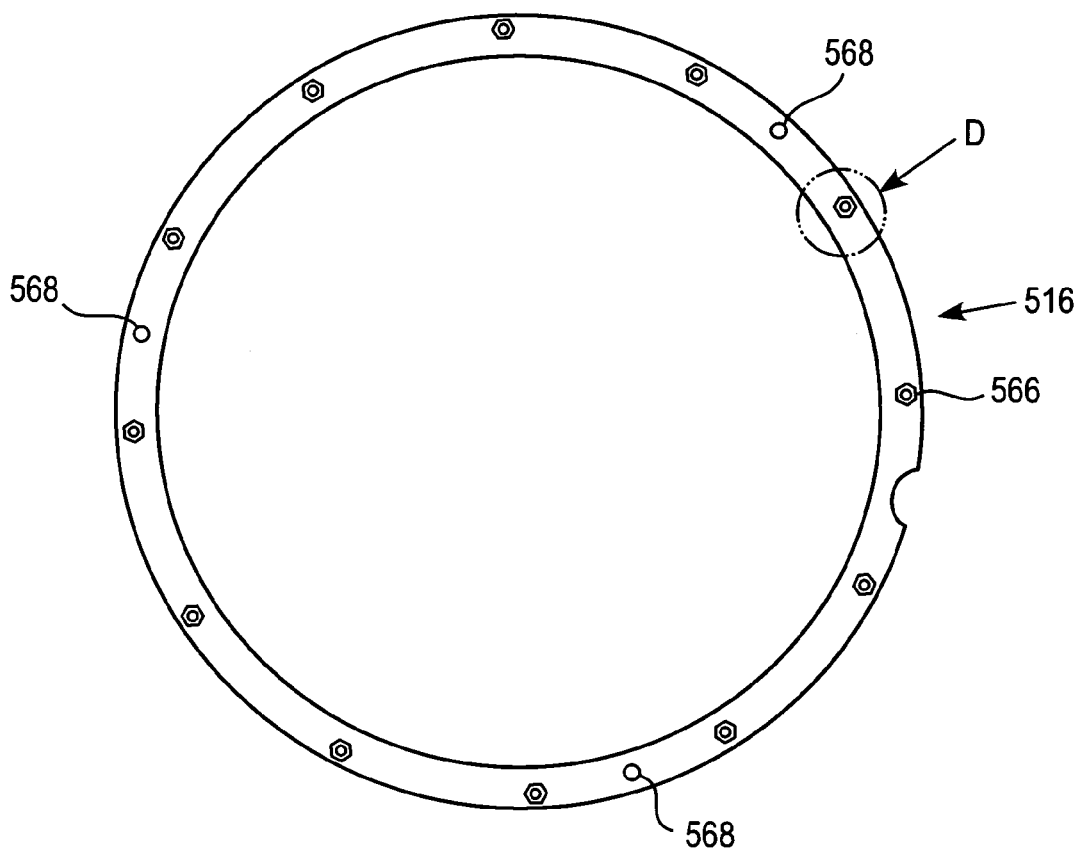
Figure 8C:
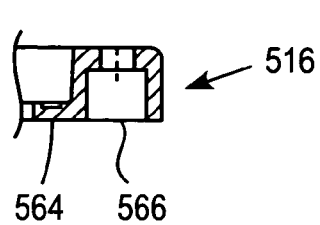
Figure 8D:
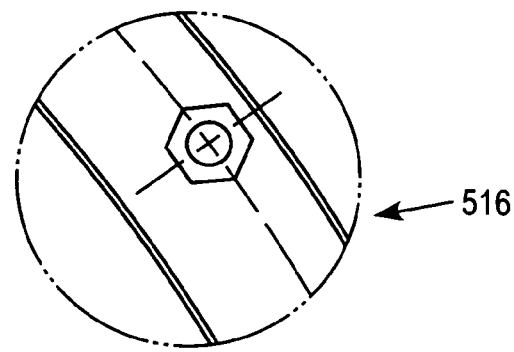

FIG. 8A is a side view of the clamp ring 516 and FIG. 8B is a bottom view showing bores 566 evenly spaced apart. FIG. 8C is a cross section of the clamp ring from detail C in FIG. 8A and FIG. 8D is a plan view of the clamp ring from detail D in FIG. 8B. As can be seen in FIGS. 8B and D, the larger portion of the stepped bores 566 is polygonal to prevent rotation of polygonal lock washers having serrations facing the heads of the screws to inhibit loosening of the screws during temperature cycling of the showerhead electrode assembly. The clamp ring can include openings 568 for receiving lower shafts of jackscrews 570 extending from backing plate 506. The flanges of the jackscrews are received in depressions in the opposite side of the clamp ring. Thus during mounting of the inner electrode, the jackscrews aid in aligning the clamp ring with the backing plate. For disassembly, as explained earlier, three equally spaced jackscrews can be used to dislodge the inner electrode from the backing plate 506.

As explained above, the clamp ring 516 can include lock washers to prevent the fasteners holding the clamp ring against the backing plate 506 from loosening due to differential thermal expansion and contraction. For example, lock washers comprising upper and lower washer halves having radial grooves on one side and a series of tapered steps on the opposite side are fitted on the screws with the tapered surfaces facing each other to maintain the grooved upper and lower surfaces parallel to each other during tightening of the screws. The differential thermal expansion and contraction could lead to backing out of the fasteners (e.g., screws or bolts) during sequential processing of individual wafers in the chamber. It would be desirable for the clamp ring to provide adequate clamping of the inner electrode for at least 500 RF hours (time during which plasma is generated in the chamber during wafer processing). Assuming plasma process time of 300 seconds per wafer, 500 RF hours would allow processing of 6000 wafers.

To compensate for the differential thermal expansion, the clamp ring 516 can be designed to absorb thermal load due to expansion by incorporating thermal expansion regions 577 which compress circumferentially to maintain a substantially constant clamp ring diameter during temperature cycling. A suitable clamp ring design is described in commonly-owned U.S. Pat. No. 6,200,415, which is hereby incorporated by reference in its entirety.

Figure 9A:
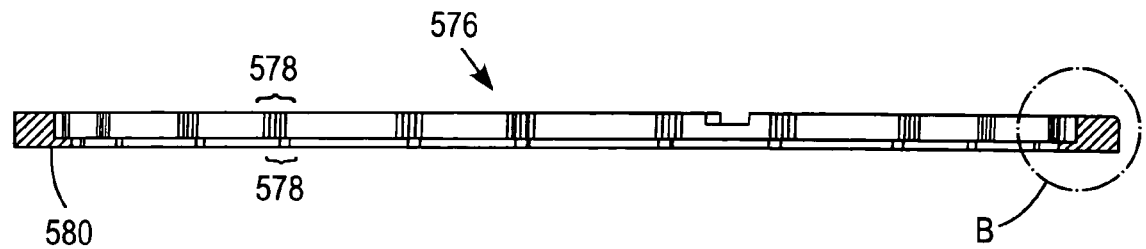
FIGS. 9A-F show details of a clamp ring with thermal expansion regions.
Figure 9B:
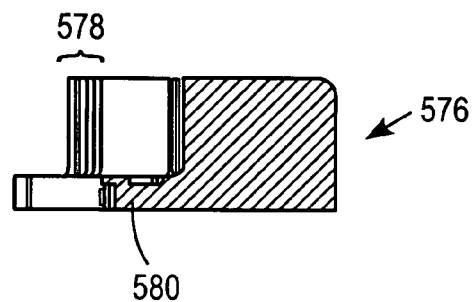
Figure 9C:
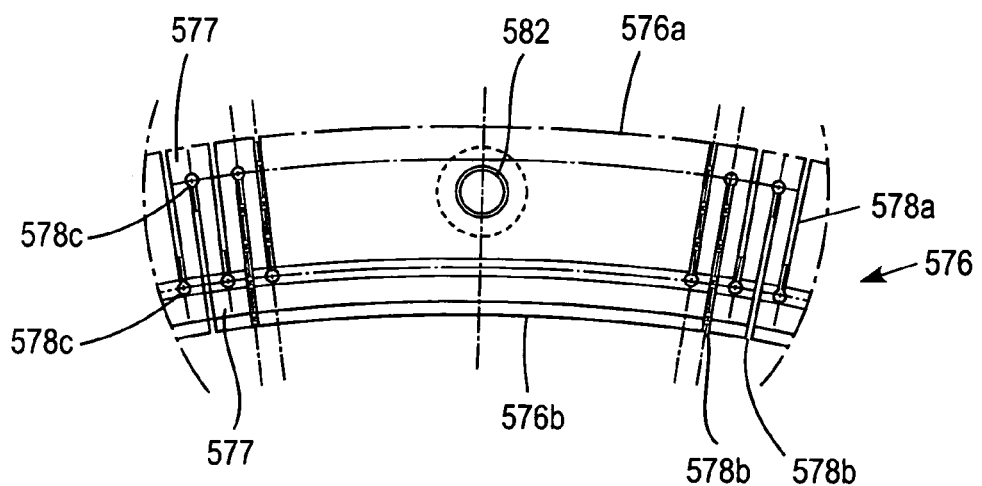
Figure 9E:
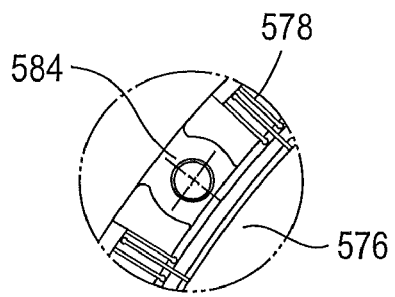
Figure 9F:
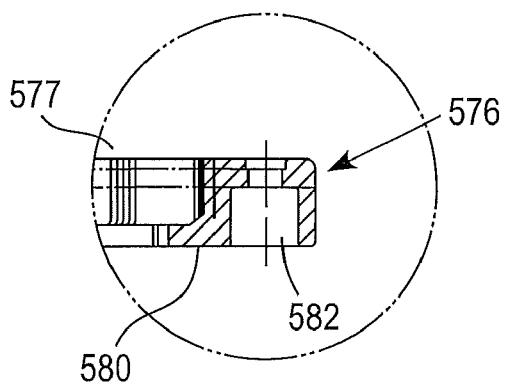
Figure 9D:
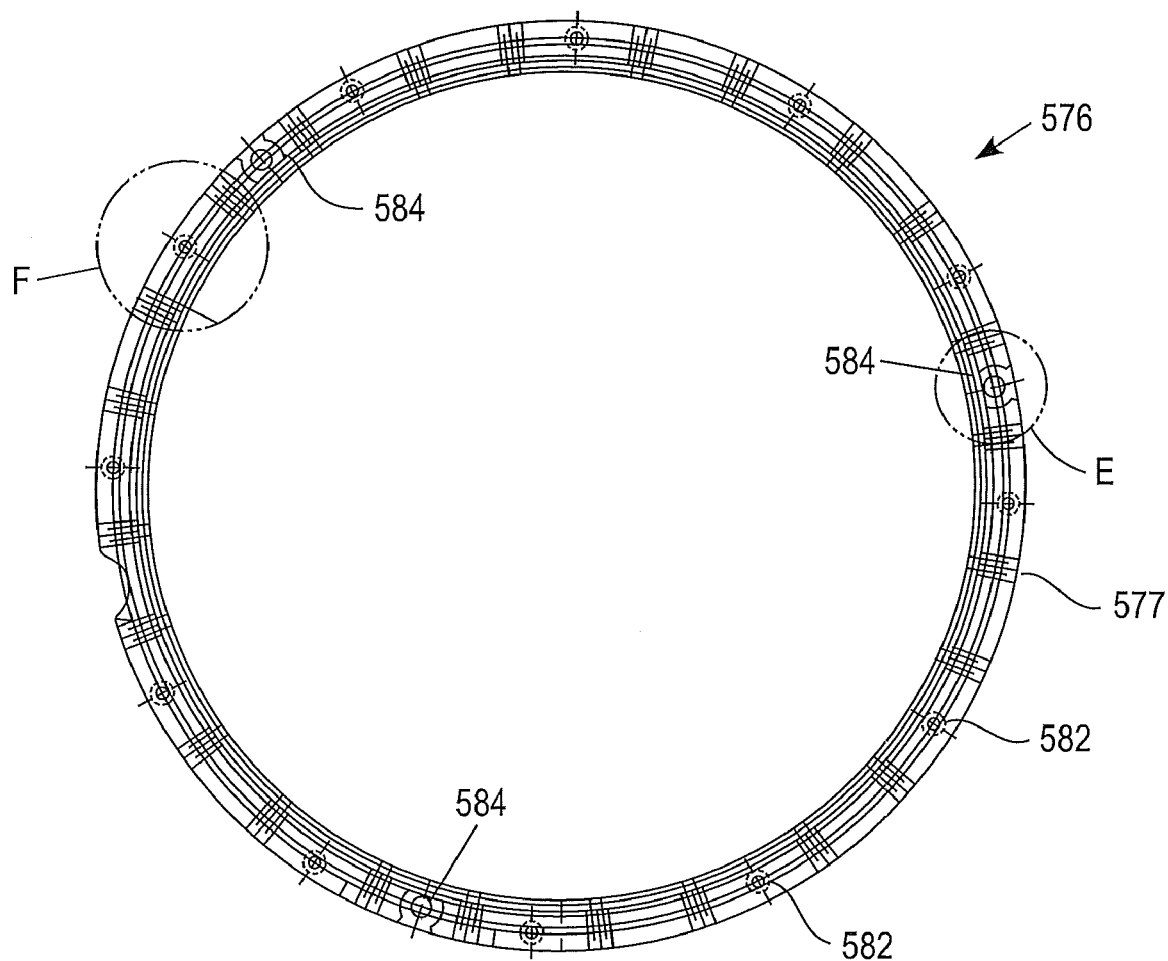

Another suitable clamp ring design is illustrated in FIGS. 9A-F wherein FIG. 9A is a side view of a clamp ring 576, FIG. 9B shows features of detail B in FIG. 9A, FIG. 9C is a partial top view of the clamp ring showing features of thermal expansion regions 577 formed by slots 578, FIG. 9D is a top view of the ring shown in FIG. 9A, FIG. 9E shows features of detail E in FIG. 9D and FIG. 9F shows features of detail F in FIG. 9D.

As shown in FIG. 9A, clamp ring 576 can include thermal expansion regions 577 in the form of radially extending slots 578. Preferably, the slots 578 are arranged in groups of slots with adjacent slots extending from an inner or outer periphery of the clamp ring. For example, each group of slots can include 2 or more slots forming one or more U-shaped expansion/contraction regions 577 (e.g. 3 slots form one U-shaped region and 5 slots form 2 U-shaped regions). In the 5 slot embodiment, three slots 578a extend inwardly from the outer periphery 576a and two slots 578b extend outwardly from the inner periphery 576b with the outwardly extending slots located between the inwardly extending slots. Each slot can terminate a rounded end wall 578c located close to the inner or outer periphery. For example, the inwardly extending slots can extend over 50% of the width of the clamp ring such that the rounded end wall is located within ½ the distance to the inner periphery. Preferably, the slots extend over 75%, more preferably over 80%, and most preferably over 90% of the width of the clamp ring.

For processing 300 mm wafers, the inner electrode has a diameter of 12 to 13 inches and the clamp ring has a slightly larger diameter with an inwardly extending flange 580 to engage the outer step 534 of the inner electrode 504. The clamp ring 576 can include at least 4 groups of slots, preferably at least 8 groups of slots, more preferably at least 16 groups of slots and most preferably 24 groups of slots. In a preferred embodiment, the slots have a width of about 0.03 to 0.1 inch, preferably about 0.05 to 0.09 inch and most preferably about 0.06 to 0.08 inch and the rounded end wall has a diameter larger than the slot width. Each stepped bore 582 for receipt of a clamping fastener can be located between each group of slots or if fewer fasteners are used than the number of groups of slots, the stepped bores 582 can be located between every other group of slots or located in any other desired arrangement.

To prevent backing out of the fasteners, the shaft of the fasteners can include a lock washer such as the paired lock washer halves described above. For example, one or more lock washers which are not rotatable due to the corresponding shape of the larger portion of the stepped bores can be used to engage the underside of the fastener head to prevent rotation of the fastener during temperature cycling of the clamp ring.

FIGS. 10A-C show details of backing plate 506 wherein FIG. 10A is a front planar view of the upper face 584 of the backing plate, FIG. 10B is a front planar view of the lower face 586 of the backing plate and FIG. 10C is a transverse cross-section taken at a location intersecting bores 560 for two cam locks.

The upper face 584 of backing plate 506 engages three annular projections 511 (see FIG. 5A) on thermal control plate 510 at annular regions 588 which include threaded openings for receipt of fasteners extending through the thermal control plate 510 to attach the backing plate thereto. Additional threaded openings are located in the peripheral portion of the upper face for receiving additional fasteners. Thirteen rows of holes 590 extend between the upper and lower faces so as to align with the gas holes in the inner electrode. The holes 590 are larger than the inner electrode gas passages to maintain alignment while compensating for differential thermal expansion. Details of hole sizes to accommodate thermal expansion are disclosed in commonly-assigned U.S. Patent Publication Nos. 2008/0141941 and 2008/0090417, the disclosures of which are hereby incorporated by reference. Thermal interface pads are preferably interposed between the projections 511 and the regions 588 to enhance thermal and electrical conduction. To monitor chamber vacuum pressure a group of holes 592 matching the holes 552 in the outer electrode is located inwardly of a groove 594 which receives a gas seal such as an O-ring.

The lower face 586 includes annular regions 596 at which thermal interface material such as Q-pads are interposed between the backing plate and the inner electrode. Grooves 598 for receipt of gas seals (O-rings) separate the gas holes 590 into a central zone and an outer annular zone. Alignment pin holes 600 are sized to receive the alignment pins extending upwardly from the inner and outer electrodes with the alignment holes located further from the center pin hole being enlarged or elongated to accommodate differential thermal expansion and contraction between the electrodes and the backing plate. The lower face includes 8 vertically extending stepped bores 602 which receive the locking pins 562 extending upwardly from the outer electrode. Horizontally extending bores 604 receive the cylindrical cam locks 514 discussed above.

While the invention has been described in detail with reference to specific embodiments thereof, it will be apparent to those skilled in the art that various changes and modifications can be made, and equivalents employed, without departing from the scope of the appended claims.

What is claimed is:

1. A showerhead electrode assembly wherein the showerhead electrode comprises an upper electrode of a capacitively coupled plasma processing chamber, comprising:
   a backing plate having gas passages extending between upper and lower faces thereof;
   a clamp ring having an inwardly extending flange and stepped bores configured to receive fasteners which engage threaded openings in the lower face of the backing plate;
   the showerhead electrode comprising a plate having a plasma exposed surface on a lower face thereof, a mounting surface on an upper face thereof, the inner face including an outer step at an outer periphery of the plate, the outer step configured to mate with the inwardly extending flange of the clamp ring, the plate including process gas outlets arranged in a pattern matching the gas passages in the backing plate: and
   a compression ring between opposed surfaces of the clamp ring flange and the outer step of the showerhead electrode;
   jackscrews mounted in the lower face of the backing plate, the jackscrews being rotatable to move annular flanges on the jackscrews against the upper face of the showerhead electrode to separate the showerhead electrode from the backing plate during disassembly of the showerhead electrode.

2. The showerhead electrode assembly of claim 1, wherein the jackscrews include upper threaded shafts which engage threaded openings in the lower face of the backing plate, and lower shafts having keyed openings to engage a tool which rotates each of the jackscrews, the electrode assembly further comprising an upper polymer ring with openings receiving the fasteners holding the clamp ring to the backing plate and openings receiving the upper shafts, the polymer ring located between opposed surfaces of each of the annular flanges and the backing plate, and polymer washers surrounding the lower shafts and located between opposed surfaces of each of the annular flanges and the showerhead electrode.

3. The showerhead electrode assembly of claim 1, wherein the clamp ring includes thermal expansion regions to accommodate thermal expansion of the clamp ring.

4. The showerhead electrode assembly of claim 3, wherein the thermal expansion regions comprise inward slots extending from an outer periphery of the clamp ring and outward slots extending from an inner periphery of the clamp ring.

5. The showerhead electrode assembly of claim 4, wherein the slots are arranged in groups of alternating inward and outward slots, each group of slots including two outward slots extending from the inner periphery of the clamp ring and terminating in rounded end walls and three inward slots extending from the outer periphery of the clamp ring and terminating in rounded end walls.

6. The showerhead electrode assembly of claim 1, further comprising a thermal interface ring and a gas seal between the backing plate and the showerhead electrode, the gas seal being located outwardly of the gas passages and the thermal interface ring.

7. The showerhead electrode assembly of claim 1, further comprising a compression ring between the flange of the clamp ring and the outer step of the showerhead electrode.

8. An outer electrode of a showerhead electrode assembly wherein the outer electrode surrounds an inner electrode and the showerhead electrode comprises an upper electrode of a capacitively coupled plasma processing chamber, comprising:

an annular plate having a plasma exposed surface on a lower face thereof and a mounting surface on an upper face thereof, the upper face including a planar annular surface between an annular upper inner step and an annular upper outer step, the plasma exposed surface including inner and outer inclined surfaces;

a plurality of circumferentially spaced apart pockets in the planar annular surface configured to receive locking pins therein adapted to clamp the outer electrode to a backing plate of the showerhead electrode assembly;

alignment pin bores in the upper face, the alignment pin bores configured to align with alignment pins extending into the backing plate, the outer upper step configured to support a guard ring of the showerhead electrode assembly such that an outer surface of the guard ring is flush with the outer surface of the outer electrode.

9. The outer electrode as claimed in claim 8, further comprising gas holes in a planar annular surface of the lower face, the gas holes adapted to provide vacuum pressure measurements in the chamber, the planar annular surface extending between the inner and outer inclined surfaces, the outer inclined surface forming an angle of less than 30 degrees with the planar annular surface, and the inner inclined surface forming an angle of greater than 30 degrees with the annular planar surface.

10. A showerhead electrode assembly of a capacitively coupled plasma processing chamber, comprising:
a thermal control plate supported by a temperature controlled top wall of the plasma processing chamber, the thermal control plate having a diameter larger than a wafer to be processed in plasma processing chamber and including at least one gas plenum in a lower face thereof;
a backing plate supported by the thermal control plate, the backing plate having a diameter smaller than the thermal control plate, gas passages extending vertically therethrough and communicating with the at least one gas plenum and rotatable cam locks in bores extending horizontally into an outer periphery of the backing plate;
a guard ring surrounding the backing plate, the guard ring including at least one horizontally extending access bore passing through the guard ring, the guard ring being rotatable around the backing plate to align the access bore with at least one of the cam locks;
an inner electrode having gas passages extending vertically therethrough in fluid communication with the gas passages in the backing plate, an outer periphery of the inner electrode including inner and outer steps, the outer step being located between the inner step and a surface of the inner electrode facing the backing plate;
a clamp ring having an inner flange overlying the outer step of the inner electrode with an optional compression ring therebetween, the clamp ring including vertically extending stepped openings, the stepped openings being aligned with threaded holes in the backing plate and fasteners in the stepped openings attaching the clamp ring to the backing plate; and
an outer electrode surrounding the inner electrode and including vertically extending locking pins which engage the cam locks, the outer electrode supporting the guard ring and being removable by releasing the locking pins from the cam locks.

11. The electrode assembly of claim 10, wherein the backing plate includes vertically extending bores aligned with the locking pins in the outer electrode and horizontally extending bores communicating with the axially extending bores, the cam locks including rotatable camshafts mounted in the horizontally extending bores, the locking pins including shafts with enlarged heads at free ends thereof and bases of the pins located in sockets, the camshafts including a cam surface adapted to engage the heads of the locking pins so as to mechanically clamp the outer electrode to the backing plate.

12. The electrode assembly of claim 11, wherein the locking pins are movable vertically and laterally in the sockets to accommodate differential thermal expansion of the backing plate and the outer electrode.

13. The electrode assembly of claim 10, wherein the clamp ring includes thermal expansion regions to accommodate thermal expansion of the clamp ring.

14. The electrode assembly of claim 10, wherein the inner electrode is a plate of single crystal silicon and the backing plate is a plate of an aluminum alloy.

15. The electrode assembly of claim 10, further comprising jackscrews mounted in the lower face of the backing plate, the jackscrews being rotatable to move flanges on the jackscrews against the upper face of the inner electrode to separate the inner electrode from the backing plate during disassembly of the inner electrode.

16. The electrode assembly of claim 10, wherein the thermal control plate includes annular projections on a lower face thereof defining gas plenums in communication with the gas passages in the backing plate and at least two thermal interface rings are between the inner electrode and the backing plate.

17. The electrode assembly of claim 16, further comprising a gas seal between the backing plate and the showerhead electrode, the gas seal being located outwardly of the gas passages and the outermost thermal interface ring.

* * * * *